United States Patent
Seo et al.

(10) Patent No.: US 8,115,382 B2
(45) Date of Patent: Feb. 14, 2012

(54) LIGHT-EMITTING ELEMENT, LIGHT-EMITTING DEVICE, AND ELECTRONIC DEVICE, COMPRISING CONTROLLED CARRIER TRANSPORT

(75) Inventors: Satoshi Seo, Kanagawa (JP); Tsunenori Suzuki, Kanagawa (JP); Kaoru Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 677 days.

(21) Appl. No.: 12/212,336

(22) Filed: Sep. 17, 2008

(65) Prior Publication Data
US 2009/0079337 A1    Mar. 26, 2009

(30) Foreign Application Priority Data
Sep. 20, 2007   (JP) ................. 2007-243270

(51) Int. Cl.
*H01L 51/50* (2006.01)
*H01L 51/52* (2006.01)
*H01L 51/54* (2006.01)

(52) U.S. Cl. ........ 313/506; 313/504; 428/690; 428/917; 257/40; 257/72

(58) Field of Classification Search .......... 313/498–512; 428/690–691, 917; 257/40, 72, 98–100, 257/642–643, 759; 438/26–29, 34, 82
See application file for complete search history.

(56) References Cited

U.S. PATENT DOCUMENTS

| | | | |
|---|---|---|---|
| 5,792,557 A * | 8/1998 | Nakaya et al. ............. | 428/411.1 |
| 6,387,546 B1 | 5/2002 | Hamada et al. | |
| 6,465,953 B1 * | 10/2002 | Duggal ....................... | 313/553 |
| 7,342,355 B2 * | 3/2008 | Seo et al. ..................... | 313/504 |
| 7,592,193 B2 * | 9/2009 | Yamazaki et al. ............. | 438/29 |
| 2004/0142209 A1 * | 7/2004 | Toguchi et al. .............. | 428/690 |
| 2005/0100760 A1 | 5/2005 | Yokoyama | |

(Continued)

FOREIGN PATENT DOCUMENTS
EP  1 565 041 A1   8/2005
(Continued)

OTHER PUBLICATIONS

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

(Continued)

*Primary Examiner* — Nimeshkumar Patel
*Assistant Examiner* — Jose M Diaz
(74) *Attorney, Agent, or Firm* — Husch Blackwell LLP

(57) ABSTRACT

It is an object of the present invention to provide a light-emitting element with high light emission efficiency and with a long lifetime. A light-emitting device comprises a first electrode, a second electrode, a light-emitting layer, a first layer, and a second layer, wherein the first layer is provided between the light-emitting layer and the first electrode, the second layer is provided between the light-emitting layer and the second electrode, the first layer is a layer for controlling the hole transport, the second layer is a layer for controlling the electron transport, and light emission from the light-emitting layer is obtained when voltage is applied to the first electrode and the second electrode so that potential of the first electrode is higher than potential of the second electrode.

42 Claims, 14 Drawing Sheets

U.S. PATENT DOCUMENTS

| | | | |
|---|---|---|---|
| 2006/0011908 A1 | 1/2006 | Ohsawa et al. | |
| 2006/0043859 A1 | 3/2006 | Fukuoka et al. | |
| 2006/0158102 A1 | 7/2006 | Kawamura et al. | |
| 2007/0172699 A1 | 7/2007 | Nakashima et al. | |
| 2008/0006821 A1 | 1/2008 | Suzuki et al. | |
| 2008/0007165 A1 | 1/2008 | Suzuki et al. | |
| 2009/0051274 A1* | 2/2009 | Hayashi | 313/504 |
| 2009/0191781 A1* | 7/2009 | Ishida et al. | 445/24 |
| 2009/0317733 A1* | 12/2009 | Okura et al. | 430/56 |
| 2010/0133523 A1* | 6/2010 | Nowatari et al. | 257/40 |
| 2010/0181898 A1* | 7/2010 | Nakamura et al. | 313/504 |

FOREIGN PATENT DOCUMENTS

| | | |
|---|---|---|
| JP | 03190088 A * | 8/1991 |
| JP | 2000-68057 | 3/2000 |
| JP | 2004-221045 | 8/2004 |
| JP | 2004-273163 | 9/2004 |
| JP | 2006-156888 | 6/2006 |
| WO | WO 2004/047499 A1 | 6/2004 |
| WO | WO 2006/059512 A1 | 6/2006 |
| WO | WO 2006/059736 A1 | 6/2006 |

OTHER PUBLICATIONS

Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi.T et al, "A Method of Measuring an Energy Level," High Molecular EL Materials—Development of Light-Emitting High Molecular Compounds, Kyoritsu Shuppan, Dec. 25, 2004, pp. 64-67 (with English translation, pp. 1-3).

Cina, S. et al, "P-135: Efficient Electron Injection from PEDOT-PSS into a Graded-n-Doped Electron Transporting Layer in an Inverted OLED Structure," SID 05 Digest: SID International Symposium Digest of Technical Papers, vol. 36, 2005, pp. 819-821.

Lee, M-T et al, "Improved Stability of Organic Electroluminescent Devices by Doping Styrylamines in Hole or Electron Transporting Layer," Applied Physics Letters, vol. 86, No. 10, 2005, pp. 103501-1-103501-3.

European Search Report re application No. EP 07012956.4, dated Oct. 5, 2007.

* cited by examiner

LIGHT-EMITTING ELEMENT, LIGHT-EMITTING DEVICE, AND ELECTRONIC DEVICE, COMPRISING CONTROLLED CARRIER TRANSPORT

BACKGROUND OF THE INVENTION

1. Field of the Invention

The present invention relates to current excitation type light-emitting elements. In addition, the present invention relates to light-emitting devices and electronic devices which have the light-emitting elements.

2. Description of the Related Art

In recent years, research and development have been extensively conducted on light-emitting elements utilizing electroluminescence. In a basic structure of such a light-emitting element, a substance having a light-emitting property is interposed between a pair of electrodes. By applying voltage to this element, light can be emitted from the substance having a light-emitting property.

Since such a light-emitting element is a self-light-emitting type, it has advantages over a liquid crystal display such as higher visibility of pixels and unnecessity of a backlight. Accordingly, such a light-emitting element is considered suitable as a flat panel display element. In addition, other advantages of such a light-emitting element are that it can be manufactured to be thin and lightweight and the response speed is very high.

Furthermore, since such a light-emitting element can be formed into a film shape, surface light emission can be easily obtained by forming a large-area element. This is a feature that is difficult to be obtained from a point light source typified by a filament lamp and an LED or a linear light source typified by a fluorescent light. Therefore, the light-emitting element has a high utility value as a plane light source that can be applied to lighting or the like.

Light-emitting elements utilizing electroluminescence are classified broadly according to whether they use an organic compound or an inorganic compound as a substance having a light-emitting property.

When an organic compound is used as a substance having a light-emitting property, electrons and holes are injected into a layer containing the organic compound having a light-emitting property from a pair of electrodes by voltage application to a light-emitting element, so that current flows therethrough. Then, these carriers (electrons and holes) are recombined; thus, the organic compound having a light-emitting property is brought into an excited state. When the light-emitting organic compound returns to a ground state from the excited state, it emits light. Based on this mechanism, such a light-emitting element is referred to as a current-excitation light-emitting element.

Note that the excited state of an organic compound can be either a singlet excited state or a triplet excited state, and light emission from the singlet excited state is referred to as fluorescence and light emission from the triplet excited state is referred to as phosphorescence.

As for such a light-emitting element, there are many problems depending on materials in improving element characteristics, and improvement in element structure, development of materials, and the like have been conducted to overcome the problems.

For example, in Non-Patent Document 1 (Non-Patent Document 1: Tetsuo TSUTSUI and eight others, Japanese Journal of Applied Physics vol. 38, L1502 to L1504, (1999)), a hole-blocking layer is provided so that a light-emitting element using a phosphorescent material efficiently emits light. However, as described in Non-Patent Document 1, a hole-blocking layer has poor durability, and the light-emitting element has a very short lifetime. Thus, development of a light-emitting element with a long lifetime has been desired.

SUMMARY OF THE INVENTION

In view of the foregoing problems, it is an object of the present invention to provide a light-emitting element with a long lifetime. In addition, it is another object of the present invention to provide a light-emitting device and an electronic device with a long lifetime.

As a result of diligent studies, the present inventors have found that a light-emitting element with a long lifetime can be obtained by providing a layer for controlling the carrier transport.

One aspect of the present invention is a light-emitting element including a light-emitting layer, a first layer, and a second layer between a first electrode and a second electrode, wherein the first layer is provided between the light-emitting layer and the first electrode, the second layer is provided between the light-emitting layer and the second electrode, the first layer contains a first organic compound and a second organic compound, the weight percent of the first organic compound is higher than the weight percent of the second organic compound in the first layer, the first organic compound has a hole-transporting property, the second organic compound has an electron-transporting property, the second layer contains a third organic compound and a fourth organic compound, the weight percent of the third organic compound is higher than the weight percent of the fourth organic compound in the second layer, the third organic compound has an electron-transporting property, the fourth organic compound has an electron-trapping property, and light emission from the light-emitting layer can be obtained when voltage is applied to the first electrode and the second electrode so that potential of the first electrode is higher than potential of the second electrode.

In the above structure, the difference between the highest occupied molecular orbital levels of the first organic compound and the second organic compound is preferably less than 0.3 eV.

In the above structure, the first organic compound is preferably an aromatic amine compound and the second organic compound is preferably a metal complex.

In the above structure, $P_1/P_2 \geqq 3$ or $P_1/P_2 \leqq 0.33$ is preferably satisfied where a dipole moment of the first organic compound is $P_1$ and a dipole moment of the second organic compound is $P_2$.

In the above structure, the thickness of the first layer is preferably from 5 nm to 20 nm, inclusive.

In the above structure, the first layer and the light-emitting layer are preferably provided to be in contact with each other.

In addition, the lowest unoccupied molecular orbital level of the fourth organic compound is preferably lower than the lowest unoccupied molecular orbital level of the third organic compound by 0.3 eV or more.

In addition, the third organic compound is preferably a metal complex.

In addition, the fourth organic compound is preferably a coumarin derivative or a quinacridone derivative.

In the above structure, the thickness of the second layer is preferably from 5 nm to 20 nm, inclusive.

In the above structure, the second layer and the light-emitting layer are preferably provided to be in contact with each other.

The present invention includes a light-emitting device having the above-described light-emitting element. The light-emitting device in this specification includes an image display device, a light-emitting device, or a light source (including a lighting device). Further, the following are also referred to as a light-emitting device: a module in which a connector, for example, a flexible printed circuit (FPC), a tape automated bonding (TAB) tape, or a tape carrier package (TCP) is attached to a panel provided with a light-emitting element; a module provided with a printed wiring board at the end of the TAB tape or the TCP; and a module in which an integrated circuit (IC) is directly mounted to a light-emitting element by a chip on glass (COG) method.

Further, an electronic device using the light-emitting element of the present invention in its display portion is also included in the present invention. Accordingly, an electronic device of the present invention includes a display portion which is provided with the above-described light-emitting element and a control means to control light emission of the light-emitting element.

In the light-emitting element of the present invention, a layer for controlling the carrier transport is provided; therefore, a light-emitting element with a long lifetime can be obtained.

Further, the light-emitting device and the electronic device with a long lifetime can be obtained by applying a light-emitting element of the present invention to a light-emitting device and an electronic device.

DETAILED DESCRIPTION OF THE INVENTION

Figure 1A:
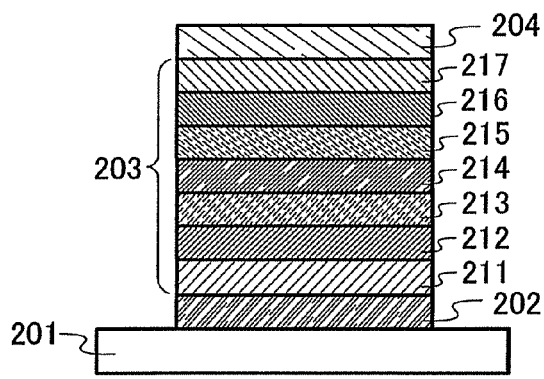
FIGS. 1A to 1D each illustrate a light-emitting element of the present invention.

The embodiment modes of the present invention are hereinafter described in detail with reference to the drawings. Note that the present invention is not limited to the following description and it will be readily appreciated by those who skilled in the art that modes and details can be modified in various ways without departing from the spirit and the scope of the present invention. Accordingly, the present invention should not be construed as being limited to the description of the embodiment modes to be given below.

Embodiment Mode 1

One mode of a light-emitting element according to the present invention is hereinafter described with reference to FIGS. 1A to 1D. A light-emitting element according to the present invention has a layer for controlling the hole transport and a layer for controlling the electron transport.

A light-emitting element of the present invention has a plurality of layers between a pair of electrodes. The plurality of layers are a combination of layers formed of a material having a high carrier-injecting property and a material having a high carrier-transporting property. Those layers are stacked so that a light-emitting region is formed in a region away from the electrodes, that is, carriers are recombined in an area away from the electrodes.

In this embodiment mode, a light-emitting element has a first electrode 202, a second electrode 204, and an EL layer 203 provided between the first electrode 202 and the second electrode 204. Note that this embodiment mode is described below assuming that the first electrode 202 serves as an anode and the second electrode 204 serves as a cathode. That is, in the following description, it is assumed that when voltage is applied to the first electrode 202 and the second electrode 204 so that potential of the first electrode 202 is higher than potential of the second electrode 204, light is emitted.

A substrate 201 is used as a support of the light-emitting element. For the substrate 201, glass, plastic, or the like can be used, for example. Note that other materials may also be used as long as they serve as a support in a manufacturing process of the light-emitting element.

As for the first electrode 202, a metal, an alloy, a conductive compound, a mixture thereof, or the like having a high work function (specifically, preferably 4.0 eV or higher) is preferably used. For example, indium tin oxide (ITO), indium tin oxide containing silicon or silicon oxide, indium zinc oxide (IZO), indium oxide containing tungsten oxide and zinc oxide (IWZO), and the like can be given. A film of such a conductive metal oxide is generally formed by sputtering, but may be formed by an inkjet method, a spin coating method, or the like by application of a sol-gel method or the like. For example, a film of indium zinc oxide (IZO) can be formed by a sputtering method using a target in which zinc oxide is added into indium oxide at 1 to 20 wt %. Further, a film of indium oxide containing tungsten oxide and zinc oxide (IWZO) can be formed by a sputtering method using a target in which tungsten oxide and zinc oxide are included in indium oxide at 0.5 to 5 wt % and at 0.1 to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), and the like can be given.

In a case where a layer containing a composite material described below is used as a layer which is in contact with the first electrode, any of various metals, alloys, electrically conductive compounds, or a mixture thereof can be used for the first electrode regardless of the work function. For example, aluminum (Al), silver (Ag), an alloy containing aluminum (AlSi), or the like can be used. Besides, any of the following materials with a low work function can be used for the first electrode: elements belonging to Group 1 and Group 2 of the periodic table, that is, alkali metals such as lithium (Li) and cesium (Cs) and alkaline earth metals such as magnesium (Mg), calcium (Ca), and strontium (Sr); alloys thereof (e.g., MgAg and AlLi); rare earth metals such as europium (Eu) and ytterbium (Yb), and alloys thereof; and the like. A film of an alkali metal, an alkaline earth metal, or an alloy thereof can be formed by a vacuum evaporation method. In addition, a film of an alloy including an alkali metal or an alkaline earth metal can be formed by a sputtering method. Further, a film can be formed using a silver paste or the like by an inkjet method or the like.

The EL layer 203 in this embodiment mode includes a hole-injecting layer 211, a hole-transporting layer 212, a layer 213 for controlling the hole transport, a light-emitting layer 214, a layer 215 for controlling the electron transport, an electron-transporting layer 216, and an electron-injecting layer 217. Note that as long as the EL layer 203 includes a layer for controlling the carrier transport and a light-emitting layer in this embodiment mode, a stacked structure of other layers is not specifically limited. That is, there is no particular limitation on the stacked structure of the EL layer 203, and a layer for controlling the carrier transport and a light-emitting layer in this embodiment mode may be combined with a layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like. For example, the EL layer 203 can be formed by an appropriate combination of a hole-injecting layer, a hole-transporting layer, a light-emitting layer, an electron-transporting layer, an electron-injecting layer, and the like. Specific materials for each of the layers are given below.

The hole-injecting layer 211 is a layer containing a substance having a high hole-injecting property. As a substance having a high hole-injecting property, molybdenum oxide, vanadium oxide, ruthenium oxide, tungsten oxide, manganese oxide, or the like can be used. As another low molecular organic compound, a phthalocyanine-based compound such as phthalocyanine (abbreviation: $H_2Pc$), copper(II)phthalocyanine (abbreviation: CuPc), or vanadyl phthalocyanine (VOPc); an aromatic amine compound such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1); or the like can be given.

Alternatively, for the hole-injecting layer 211, a composite material in which a substance having an acceptor property is mixed into a substance having a high hole-transporting property can be used. Note that by using a material in which a substance having an acceptor property is mixed into a substance having a high hole-transporting property, a material for forming the electrode can be selected regardless of its work function. In other words, besides a material with a high work function, a material with a low work function can be used as the first electrode 202. A composite material of those substances can be formed by co-evaporation of a substance having a high hole-transporting property and a substance having an acceptor property.

Note that in this specification, "composition" refers to not only a state where two materials are simply mixed but also a state where a plurality of materials are mixed and charge is given and received between the materials.

As an organic compound which is used for a composite material, any of various compounds such as an aromatic amine compound, a carbazole derivative, aromatic hydrocarbon, or a high molecular compound (an oligomer, a dendrimer, a polymer, or the like) can be used. Note that an organic compound which is used for the composite material is preferably an organic compound having a high hole-transporting property. Specifically, a substance having a hole mobility of $10^{-6}$ $cm^2/Vs$ or higher is preferably used. However, another substance may be used as long as the hole-transporting property thereof is higher than the electron-transporting property. Examples of an organic compound that can be used for the composite material are specifically listed below.

The organic compound which can be used for the composite material is, for example, an aromatic amine compound such as MTDATA, TDATA, DPAB, DNTPD, DPA3B, PCzPCA1 PCzPCA2, PCzPCN1, 4,4'-bis[N-(1-naphthyl)-N-phenylamino]biphenyl (abbreviation: NPB or α-NPD), or N,N'-bis(3-methylphenyl)-N,N'-diphenyl-[1,1'-biphenyl]-4,4'-diamine (abbreviation: TPD); a carbazole derivative such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), or 1,4-bis[4-(N-carbazolyl)phenyl]-2,3,5,6-tetraphenylbenzene; or an aromatic hydrocarbon compound such as 2-tert-butyl-9,10-di(2-naphthyl)anthracene (abbreviation: t-BuDNA), 2-tert-butyl-9,10-di(1-naphthyl)anthracene, 9,10-bis(3,5diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA).

As the substance having an acceptor property, an organic compound such as 7,7,8,8-tetracyano-2,3,5,6-tetrafluoro-quinodimethane (abbreviation: F4-TCNQ) or chloranil; or a transition metal oxide can be given. In addition, oxide of metals that belong to Group 4 to Group 8 of the periodic table can be given as the substance having an acceptor property. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is preferable because it can be easily handled because of its stableness in the air and low hygroscopic property.

Further, for the hole-injecting layer 211, a high molecular compound (an oligomer, a dendrimer, a polymer, or the like)

can be used. For example, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine (abbreviation: Poly-TPD) can be given. In addition, a high molecular compound to which acid, for example, poly(3,4-ethylenedioxythiophene)/poly(styrenesulfonic acid) (PEDOT/PSS), or polyaniline/poly(styrenesulfonic acid) (PAni/PSS) is added can be used.

Further, a composite material formed by using the above-mentioned high molecular compound such as PVK, PVTPA, PTPDMA, or Poly-TPD and the above-mentioned substance having an acceptor property can be used for the hole-injecting layer 211.

The hole-transporting layer 212 is a layer containing a substance having a high hole-transporting property. As a substance having a high hole-transporting property, an aromatic amine compound such as NPB (or α-NPD), TPD, 4,4'-bis[N-(9,9-dimethylfluoren-2-yl)-N-phenylamino]biphenyl (abbreviation: DFLDPBi), 4,4'-bis[N-(spiro-9,9'-bifluoren-2-yl)-N-phenylamino]biphenyl (abbreviation: BSPB), or the like, which is a low molecular organic compound, can be used. Most of the substances mentioned here have a hole mobility of $10^{-6}$ cm$^2$/Vs or higher. Note that another substance may be used as long as the hole-transporting property thereof is higher than the electron-transporting property. Note that the layer containing a substance having a high hole-transporting property is not limited to a single layer, and may be two or more stacked layers containing any of the above-mentioned substances.

Further, for the hole-transporting layer 212, a high molecular compound such as PVK, PVTPA, PTPDMA, or Poly-TPD can be used.

The layer 213 for controlling the hole transport contains a first organic compound and a second organic compound and the weight percent of the first organic compound is higher than that of the second organic compound. The layer 213 for controlling the hole transport is preferably provided between the light-emitting layer 214 and the first electrode 202.

The layer 213 for controlling the hole transport in this embodiment mode contains the first organic compound and the second organic compound, and the first organic compound and the second organic compound transport different kinds of carriers.

In a case where the layer for controlling the hole transport is provided between the light-emitting layer and the second electrode serving as a cathode, the first organic compound is preferably an organic compound having a hole-transporting property, and the second organic compound is preferably an organic compound having an electron-transporting property. That is, the first organic compound is preferably a substance whose electron-transporting property is higher than the hole-transporting property, while the second organic compound is preferably a substance whose hole-transporting property is higher than the electron-transporting property. In addition, the difference between the highest occupied molecular orbital (HOMO) level of the first organic compound and that of the second organic compound is preferably less than 0.3 eV, and more preferably 0.2 eV or less. That is, it is preferable that, in thermodynamic terms, holes, which are carriers, can be easily transported between the first organic compound and the second organic compound.

Figure 4:
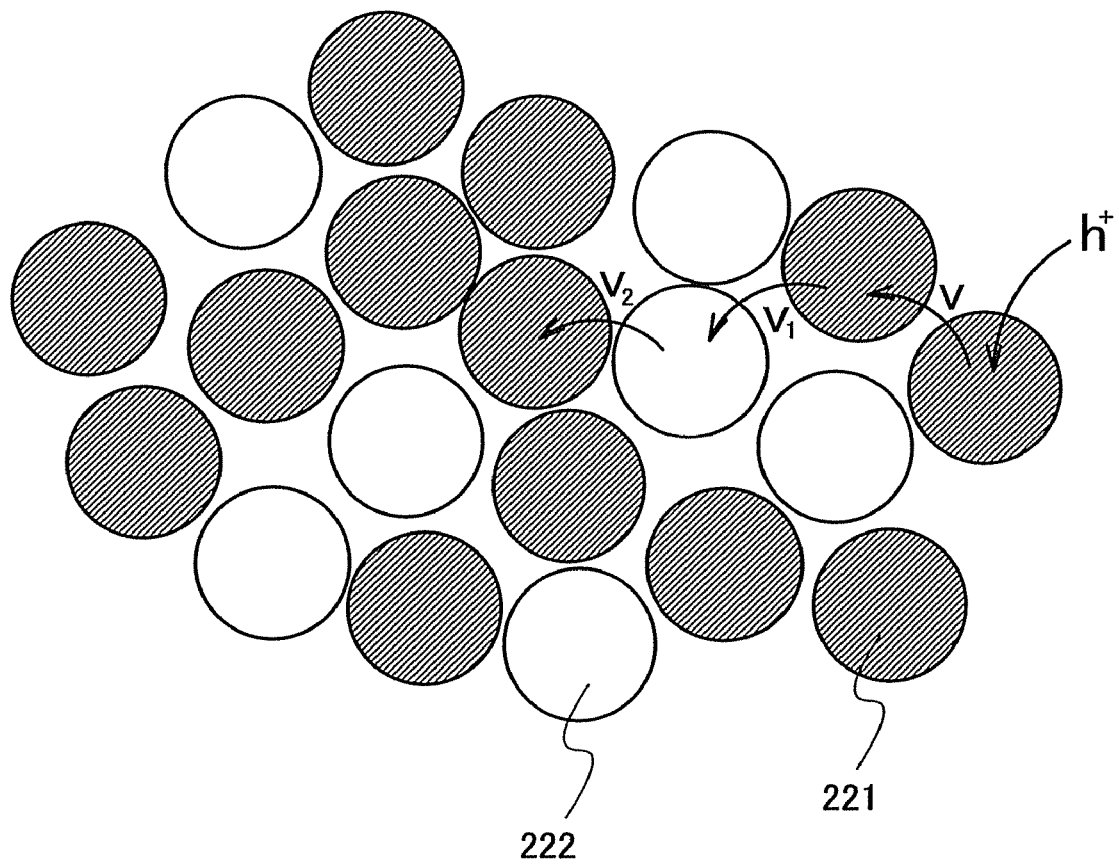
FIG. 4 illustrates a light-emitting element of the present invention.

FIG. 4 illustrates a conceptual view of a layer for controlling the carrier transport in this embodiment mode. In FIG. 4, since a first organic compound 221 has a hole-transporting property, holes are easily injected thereinto and transported to neighboring first organic compound. That is, the rate at which holes are injected into the first organic compound and the rate (v) at which the holes are released from the first organic compound are high.

Meanwhile, in thermodynamic terms, there is a possibility that holes are injected into a second organic compound 222 which is an organic compound having an electron-transporting property because the HOMO level of the second organic compound 222 is close to that of the first organic compound 221. However, the rate ($v_1$) at which holes are injected from the first organic compound 221, which is an organic compound having a hole-transporting property, into the second organic compound 222, which is an organic compound having an electron-transporting property, or the rate ($v_2$), at which holes are injected from the second organic compound 222 into the first organic compound 221, is lower than the rate (v) at which holes are injected from the first organic compound 221 into another first organic compound 221.

Since the second organic compound is contained, the hole-transporting rate of the entire layer is lower than that of a layer containing only the first organic compound 221. That is, by adding the second organic compound, the carrier transport can be controlled. Further, by controlling the concentration of the second organic compound, the carrier transporting rate can be controlled.

As described above, the first organic compound is preferably an organic compound having a hole-transporting property in this embodiment mode. Specifically, a condensed aromatic hydrocarbon such as 9,10-diphenylanthracene (abbreviation: DPAnth) or 6,12-dimethoxy-5,11-diphenylchrysene, an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine, (abbreviation: 2PCAPA), NPB (or α-NPD), TPD, DFLDPBi, or BSPB, a compound including an amino group such as Coumarin 7, or Coumarin 30, and the like can be used. Further, a high molecular compound such as PVK, PVTPA, PTPDMA, or Poly-TPD can be used.

As the second organic compound 222, an organic compound having an electron-transporting property is preferably used. Specifically, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: Zn(BTZ)$_2$), can be used. Further, as an alternative to such a metal complex, a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2''-(1,3,5-benzenetriyl)tris(1-phenyl-1H-benzimidazole) (abbreviation: TPBI), bathophenanthroline (abbreviation: BPhen), or bathocuproine (abbreviation: BCP) can be used. Further, a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5diphenylphenyl)anthracene (abbreviation: DPPA), 9,10-di (2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), or 3,3',3"-(benzene-1,3,5-triyl)tripyrene (abbreviation: TPB3) can be used. Further, a high molecular compound such as poly[(9,9-dihexylfluorene-2,7-diyl)-co-(pyridine-3,5-diyl)] (abbreviation: PF-Py), or poly[(9,9-dioctyllfluorene-2,7-diyl)-co-(2,2'-bipyridine-6,6'-diyl)] (abbreviation: PF-BPy) can be used.

By the above combination, the hole transport from the first organic compound to the second organic compound or from the second organic compound to the first organic compound is suppressed, whereby the hole-transporting rate in the layer for controlling the carrier transport can be suppressed. Further, the layer for controlling the carrier transport has a structure in which the second organic compound is dispersed into the first organic compound; therefore, crystallization or aggregation is hardly caused with time. Accordingly, the above-described effect of suppressing the hole transport is hardly changed with time, and as a result, the carrier balance hardly changes with time. This leads to improvement in lifetime, in other words, improvement in reliability of the light-emitting element.

Note that among the above-described combinations, an aromatic amine compound and a metal complex are preferably combined as the first organic compound and the second organic compound, respectively. An aromatic amine compound has a high hole-transporting property and a small dipole moment, whereas a metal complex has a high electron-transporting property and a comparatively large dipole moment. In such a manner, by combination of substances dipole moments of which are largely different from each other, the above-described effect of suppressing the hole transport becomes more significant.

Specifically, a combination which satisfies $P_1/P_2 \geqq 3$ or $P_1/P_2 \leqq 0.33$ where the dipole moment of the first organic compound is $P_1$ and the dipole moment of the second organic compound is $P_2$ is preferable. For example, the dipole moment of NPB that is one of aromatic amine compounds is 0.86 debye, and the dipole moment of Alq that is a metal complex is 9.40 debye. Accordingly, as in this embodiment mode, when an organic compound having a hole-transporting property like an aromatic amine compound is used as the first organic compound and an organic compound having an electron-transporting property like a metal complex is used as the second organic compound, $P_1/P_2 \leqq 0.33$ is preferably satisfied.

In addition, it is preferable that the emission color of the second organic compound contained in the layer 213 for controlling the hole transport and the emission color of the substance having a high light-emitting property contained in the light-emitting layer 214 be similar colors. Specifically, it is preferable that the difference between the wavelength of the highest peak of the emission spectrum of the second organic compound and the wavelength of the highest peak of the emission spectrum of the substance having a high light-emitting property be 30 nm or less. When the difference between the wavelengths of the highest peaks is 30 nm or less, the emission colors of the second organic compound and the substance having a high light-emitting property can be similar colors. Accordingly, even in the case where the second organic compound emits light due to change in voltage or the like, change in emission color can be suppressed. Note that the second organic compound does not always need to emit light.

In addition, the thickness of the layer 213 for controlling the hole transport is preferably from 5 nm to 20 nm, inclusive. When the thickness of the layer 213 for controlling the hole transport is too large, the carrier transporting rate becomes too slow, which could result in high driving voltage, in addition, the emission intensity of the layer 213 for controlling the hole transport may increase. When the thickness of the layer 213 for controlling the hole transport is too small, on the other hand, it is impossible to implement the function of controlling the carrier transport. Therefore, the thickness is preferably from 5 nm to 20 nm, inclusive.

In a conventional light-emitting element where a layer for controlling the hole transport is not provided, holes injected from the first electrode pass through a hole-injecting layer and a hole-transporting layer to be injected into a light-emitting layer. If the light-emitting layer has a hole-transporting property, that is, if the material which has the highest weight percent in the light-emitting layer has a hole-transporting property, holes injected into the light-emitting layer transfer through the light-emitting layer, and may reach an electron-transporting layer. When holes reach the electron-transporting layer, materials contained in the electron-transporting layer are degraded, leading deterioration of the light-emitting element.

However, by providing the layer 213 for controlling the hole transport described in this embodiment mode, it is possible to suppress the holes penetrating the light-emitting layer 214 and reaching the electron-transporting layer 216. Therefore, deterioration of the electron-transporting layer 216, which is caused by holes reaching the electron-transporting layer 216, can be suppressed. Accordingly, deterioration of the light-emitting element can be prevented, and the light-emitting element with a long lifetime can be obtained.

On the other hand, in a conventional element where the layer for controlling the hole transport is not provided, most of the holes injected from the first electrode are injected into the light-emitting layer without the transport being controlled. If the light-emitting layer has an electron-transporting property, that is, if a material which has the highest weight percent in the light-emitting layer has an electron-transporting property, a light-emitting region is formed in the vicinity of the interface between the light-emitting layer and the hole-transporting layer. In addition, there is a possibility that cations are generated by excessive holes in the vicinity of the interface between the light-emitting layer and the hole-transporting layer. Since a cation serves as a quencher, light emission efficiency decreases due to cations generated in the vicinity of the light-emitting region.

However, by providing the layer 213 for controlling the hole transport described in this embodiment mode, formation of cations generated by excessive holes in the light-emitting layer 214 and in the vicinity of the light-emitting layer 214 can be suppressed, and decrease in light emission efficiency can be suppressed. Accordingly, a light-emitting element with high light emission efficiency can be obtained.

As described above, by controlling the hole transport, the carrier balance is improved. As a result, the recombination probability of holes and electrons is improved and high light emission efficiency can be obtained. Note that as described in this embodiment mode, a structure in which the layer for controlling the hole transport is provided between the light-emitting layer and the first electrode serving as an anode is particularly effective for a light-emitting element having excessive holes. This is because by providing the layer for controlling the hole transport in the light-emitting element having excessive holes, the transport of excessive holes can be suppressed and controlled so that the balance of holes and electrons can be achieved.

The light-emitting layer 214 is a layer containing a substance having a high light-emitting property, and various materials can be used for the light-emitting layer 214. For example, as a substance having a high light-emitting property, a fluorescent compound which emits fluorescence or a phosphorescent compound which emits phosphorescence can be used.

Examples of a phosphorescent compound which is used for the light-emitting layer are given below. As a material for bluish light emission, bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis[2-(3',5'bistrifluoromethylphenyl)pyridinato-N,$C^{2'}$]iridium(III)picolinate (abbreviation: Ir($CF_3$ppy)$_2$(pic)), bis[2-(4',6'-difluorophenyl)pyridinato-N,$C^{2'}$]iridium(III)acetylacetonate (abbreviation: FIr(acac)) or the like can be given. As a material for greenish light emission, tris(2-phenylpyridinato-N,$C^{2'}$)iridium(III) (abbreviation: Ir(Ppy)$_3$), bis[2-phenylpyridinato-N,$C^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)) or the like can be given. As a material for yellowish light emission, bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$ (acac)) or the like can be given. As a material for orangish light emission, tris(2-phenylquinolinato-N,$C^{2'}$)iridium(III) (abbreviation: Ir(Pq)$_3$), bis(2-phenylquinolinato-N,$C^{2'}$)iridium(III)acetylacetonate (abbreviation: Ir(pq)$_2$(acac)) or the like can be given. As a material for reddish light emission, organometallic complex such as bis[2-(2'-benzo[4,5-α]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), or (2,3,7,8,12,13,17,18-octaethyl-21H,23H-porphyrinato) platinum(II) (abbreviation: PtOEP) can be given. In addition, a rare earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) performs light emission (electron transition between different multiplicities) from a rare earth metal ion; therefore, such a rare earth metal complex can be used as a phosphorescent compound.

Examples of a fluorescent compound which is used for the light-emitting layer are given below. As a material for bluish light emission, N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), or the like can be given. As a material for greenish light emission, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-di(2-biphenylyl)-2-{N-[4-(9H-carbazol-9-yl)phenyl]-N-phenylamino}anthracene (abbreviation: 2YGABPhA), N,N,9-triphenylanthracen-9-amine (abbreviation: DPhAPhA), or the like can be given. As a material for yellowish light emission, rubrene, 5,12-bis(1,1'-biphenyl-4-yl)-6,11-diphenyltetracene (abbreviation: BPT), or the like can be given. As a material for reddish light emission, N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-α]fluoranthene-3,10-diamine (abbreviation: p-mPhAFD), or the like can be given.

Note that the light-emitting layer may have a structure in which any of the above substances having a high light-emitting property (a sixth organic compound) is dispersed into another substance (a fifth organic compound). As the fifth organic compound in which the sixth organic compound is dispersed, various kinds of materials can be used, and it is preferable to use the fifth organic compound whose lowest unoccupied molecular orbital level (LUMO level) is higher than that of the sixth organic compound and whose highest occupied molecular orbital level (HOMO level) is lower than that of the sixth organic compound.

As the substance in which the substance having a light-emitting property is dispersed, specifically, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: Zn(BTZ)$_2$); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2"-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; or the like can be used.

As the substance in which the substance having a light-emitting property is dispersed, a plurality of kinds of substances can be used. For example, in order to suppress crystallization, a substance for suppressing crystallization, such as rubrene or the like may be further added. Furthermore, in order to efficiently transfer energy to the substance having a light-emitting property, NPB, Alq, or the like may be further added.

When a structure in which the substance having a high light-emitting property is dispersed into another substance is employed, crystallization of the light-emitting layer 214 can be suppressed. Further, concentration quenching due to high concentration of the substance having a high light-emitting property can be suppressed.

Note that for the light-emitting layer 214, a high molecular compound can be used. Specifically, as a material for bluish light emission, poly(9,9-dioctylfluorene-2,7-diyl) (abbreviation: POF), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-p-butylphenyl)-1,4-diaminobenzene]} (abbreviation: TAB-PFH), or the like can be given. As a material for greenish light emission, poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4,4-phenylene)], or the like can be given. As a material for orangish to reddish light emission, poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), or the like can be given.

The layer 215 for controlling the electron transport which is described in this embodiment mode contains a third organic compound and a fourth organic compound and the weight percent of the third organic compound is higher than that of the fourth organic compound. In addition, the fourth organic compound is dispersed into the third organic compound. The layer 215 for controlling the electron transport is preferably provided between the light-emitting layer 214 and the second electrode 204.

In the case of providing the layer for controlling the electron transport between the light-emitting layer and the second electrode serving as a cathode, the third organic compound is preferably an organic compound having an electron-transporting property. That is, the third organic compound is preferably a substance whose hole-transporting property is higher than the electron-transporting property.

The fourth organic compound is preferably an organic compound having a function of trapping electrons. That is, the fourth organic compound is preferably an organic compound whose lowest unoccupied molecular orbital level (LUMO level) is lower than that of the third organic compound by 0.3 eV or more.

Since the fourth organic compound is contained, the electron-transporting rate of the entire layer is lower than that of a layer containing only the third organic compound. That is, by adding the fourth organic compound, the carrier transport can be controlled. Further, by control of the concentration of the fourth organic compound, the carrier transporting rate can be controlled. Specifically, the concentration of the fourth organic compound is preferably from 0.1 wt % to 5 wt % or from 0.1 mol % to 5 mol %.

Figure 5:
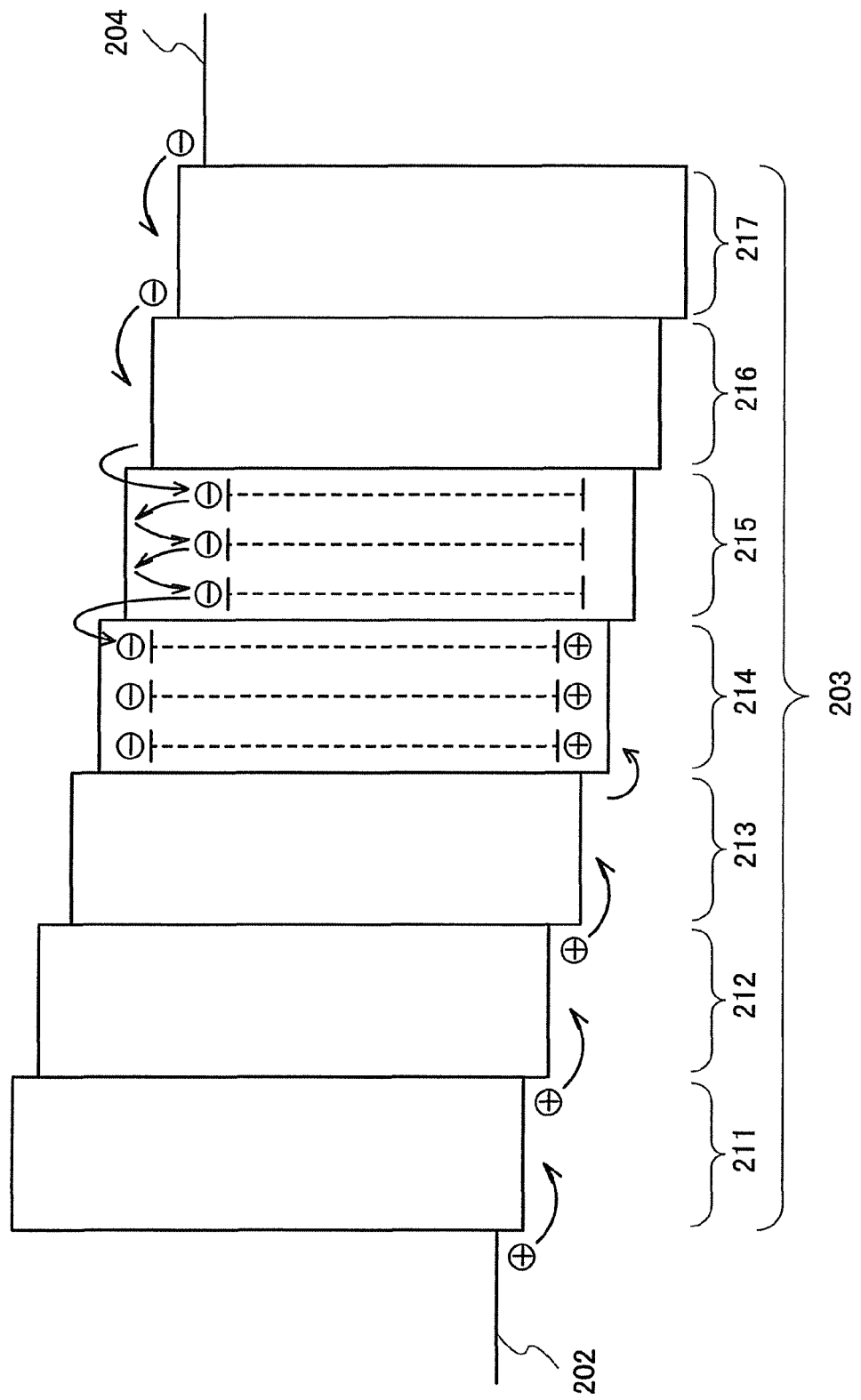
FIG. 5 illustrates a light-emitting element of the present invention.

FIG. 5 exemplarily illustrates a band diagram of a light-emitting element of the present invention in FIG. 1A. In FIG. 5, holes injected from the first electrode 202 pass through the hole-injecting layer 211, the hole-transporting layer 212, and the layer 213 for controlling the hole transport, and are injected into the light-emitting layer 214. On the other hand, electrons injected from the second electrode 204 pass through the electron-injecting layer 217, the electron-transporting layer 216, and are injected into the layer 215 for controlling the electron transport. The transport of the electrons injected into the layer 215 for controlling the electron transport is retarded by the fourth organic compound having the function of trapping electrons. The electrons of which transport is retarded are injected into the light-emitting layer 214, and then recombined with holes to emit light.

In a conventional element where a layer for controlling the electron transport is not provided, electrons injected from the second electrode pass through an electron-injecting layer and an electron-transporting layer to be injected into a light-emitting layer. If the light-emitting layer has an electron-transporting property, that is, if the material which has the highest weight percent in the light-emitting layer has an electron-transporting property, electrons injected into the light-emitting layer transfer through the light-emitting layer, and may reach a hole-transporting layer. When electrons reach the hole-transporting layer, materials contained in the hole-transporting layer are degraded, leading deterioration of the light-emitting element.

However, by providing the layer 215 for controlling the electron transport described in this embodiment mode, it is possible to suppress the electrons penetrating the light-emitting layer 214 and reaching the hole-transporting layer 212. Therefore, deterioration of the hole-transporting layer 212, which is caused by electrons reaching the hole-transporting layer 212, can be suppressed. Accordingly, deterioration of the light-emitting element can be prevented, and the light-emitting element with a long lifetime can be obtained.

In addition, it is preferable that the emission colors of the light-emitting layer and the fourth organic compound be similar colors in this Embodiment Mode. For example, when the organic compound contained in the light-emitting layer is an organic compound which exhibits bluish light emission such as YGA2S or YGAPA, the fourth organic compound is preferably a substance which exhibits blue to bluish green light emission such as acridone, coumarin 102, coumarin 6H, coumarin 480D, or coumarin 30. Thus, even if the fourth organic compound emits light unintentionally, the color purity of light emitted from the light-emitting element can be maintained.

Further, when the organic compound contained in the light-emitting layer is an organic compound which exhibits greenish light emission such as 2PCAPA, 2PCABPhA, 2DPAPA, 2DPABPhA, 2YGABPhA, or DPhAPhA, the fourth organic compound is preferably a substance which exhibits bluish green to yellowish green light emission, such as N,N'-dimethylquinacridone (abbreviation: DMQd), N,N'-diphenylquinacridone (abbreviation: DPQd), 9,18-dihydrobenzo[h]benzo[7,8]quino[2,3-b]acridine-7,16-dione (abbreviation: DMNQd-1), 9,18-dihydro-9,18-dihydrobenzo[h]benzo[7,8]quino[2,3-b]acridine-7,16-dione (abbreviation: DMNQd-2), cumarin 30, cumarin 6, cumarin 545T, or cumarin 153.

Further, when the organic compound contained in the light-emitting layer is an organic compound which exhibits yellowish light emission such as rubrene or BPT, the fourth organic compound is preferably a substance which exhibits yellowish green to yellowish orange light emission, such as DMQd or (2-{2-[4-(9H-carbazol-9-yl)phenyl]ethenyl}-6-methyl-4H-pyran-4-ylidene)propanedinitrile (abbreviation: DCMCz).

Further, when the organic compound contained in the light-emitting layer is an organic compound which exhibits reddish light emission, such as p-mPhTD or p-mPhAFD, the fourth organic compound is preferably a substance which exhibits orange to red light emission, such as 2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTB), or Nile red.

Further, when the light-emitting material contained in the light-emitting layer is a phosphorescent compound, the fourth organic compound is also preferably a phosphorescent compound. For example, when the light-emitting material is the above-mentioned $Ir(btp)_2(acac)$ which exhibits red light emission, the fourth organic compound may be a phosphorescent compound which exhibits red light emission, such as (acetylacetonato)bis[2,3-bis(4-fluorophenyl)quinoxalinato]iridium(III) (abbreviation: $Ir(Fdpq)_2(acac)$). Note that the above-mentioned compounds are compounds having a low LUMO level among compounds that can be used for light-emitting elements. Thus, by adding such a compound to the third organic compound which will be described later, an excellent electron-trapping property can be obtained.

For the fourth organic compound, among the above substances which are listed above, a quinacridone derivative such as DMQd, DPQd, DMNQd-1, or DMNQd-2 is chemically stable and thus preferable. That is, by applying a quinacridone derivative, the lifetime of the light-emitting element can be especially longer. Further, since quinacridone derivatives exhibit greenish light emission, the element structure of the light-emitting element described in this embodiment mode is especially effective for a light-emitting element exhibiting greenish light emission. Since a green color requires the highest level of luminance in forming a full-color display, a green light-emitting element may be more deteriorated than other light-emitting elements. However, such a problem can be overcome according to the present invention.

Note that the fourth organic compound is preferably a coumarin derivative such as coumarin 102, coumarin 6H, coumarin 480D, coumarin 30, coumarin 6, coumarin 545T, or coumarin 153. A coumarin derivative has a low electron-trapping property. Therefore, the concentration thereof added to the third organic compound may be relatively high. That is, the concentration can easily be controlled, and thus, a layer for controlling the carrier transport which has a desired property can be obtained. Further, since a coumarin derivative has high light emission efficiency, decrease in light emission efficiency of the entire light-emitting element can be suppressed when the fourth organic compound emits light.

The third organic compound contained in the layer 215 for controlling the electron transport is an organic compound having an electron-transporting property. That is, the third organic compound is a substance whose electron-transporting property is higher than the hole-transporting property. Specifically, any of the following can be used: a metal complex such as Alq, $Almq_3$, $BeBq_2$, BAlq, Znq, BAlq, ZnPBO, or ZnBTZ; a heterocyclic compound such as PBD, OXD-7, TAZ, TPBI, BPhen, or BCP; and a condensed aromatic compound such as CzPA, DPCzPA, DPPA, DNA, t-BuDNA, BANT, DPNS, DPNS2, or TPB3.

Further, a high-molecular compound such as poly[(9,9-dihexylfluorene-2,7-diyl)-co-(pyridine-3,5-diyl)] (abbreviation: PF-Py), or poly[(9,9-dioctyllfluorene-2,7-diyl)-co-(2,2'-bipyridine-6,6'-diyl)] (abbreviation: PF-BPy) can be used. Among them, a metal complex which is stable against electrons is preferably used.

As described above, the LUMO level of the fourth organic compound is preferably lower than that of the third organic compound by 0.3 eV or more. Therefore, a substance for the third organic compound may be selected as appropriate so as to satisfy such a condition, according to the kind of the fourth organic compound which is used. For example, when DPQd or coumarin 6 is used as the fourth organic compound, the above condition can be satisfied by using Alq as the third organic compound.

In addition, it is preferable that the emission color of the fourth organic compound contained in the layer 215 for controlling the electron transport and the emission color of the substance having a high light-emitting property contained in the light-emitting layer 214 be similar colors. Specifically, it is preferable that the difference between the wavelength of the highest peak of the emission spectrum of the fourth organic compound and the wavelength of the highest peak of the emission spectrum of the substance having a high light-emitting property be 30 nm or less. When the difference between the wavelengths of the highest peaks is 30 nm or less, the emission color of the fourth organic compound and the emission color of the substance having a high light-emitting property can be similar colors. Accordingly, even in the case where the fourth organic compound emits light due to change in voltage or the like, change in emission color of the light-emitting element can be suppressed.

The fourth organic compound does not always need to emit light. For example, in the case where light emission efficiency of the substance having a high light-emitting property is higher than that of the fourth organic compound, the concentration of the fourth organic compound in the layer 215 for controlling the electron transport is preferably adjusted (the concentration is slightly lowered so that light emission from the fourth organic compound is suppressed) so that light emitted only from the substance having a high light-emitting property is substantially obtained. In this case, since the emission colors of the substance having a high light-emitting property and the fourth organic compound are similar colors (that is, the substance having a high light-emitting property and the fourth organic compound have substantially the same energy gap), energy transfer from the substance having a high light-emitting property to the fourth organic compound does not easily occur, and thus, high light emission efficiency is obtained.

In addition, the thickness of the layer 215 for controlling the electron transport is preferably from 5 nm to 20 nm, inclusive. When the thickness of the layer 215 for controlling the electron transport is too large, the carrier transporting rate becomes too slow, which could result in high driving voltage. When the thickness of the layer 215 for controlling the electron transport is too small, on the other hand, it is impossible to implement the function of controlling the carrier transport. Therefore, the thickness is preferably from 5 nm to 20 nm, inclusive.

The electron-transporting layer 216 is a layer containing a substance having a high electron-transporting property. For example, a metal complex such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc (II) (abbreviation: ZnPBO), or bis[2-(2-benzothiazolyl)phenolato]zinc(II) (abbreviation: $Zn(BTZ)_2$), which is a low molecular organic compound, can be used. Further, as an alternative to such a metal complex, a heterocyclic compound such as 2-(4-biphenylyl)-5-(4-tert-butylphenyl)-1,3,4-oxadiazole (abbreviation: PBD), 1,3-bis[5-p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ01), 2,2',2"-(1,3,5-benzenetriyl)tris(1-phenyl-1H-benzimidazole) (abbreviation: TPBI), bathophenanthroline (abbreviation: BPhen), or bathocuproine (abbreviation: BCP) can be used. Most of the substances mentioned here have an electron mobility of $10^{-6}$ $cm^2/Vs$ or higher. Note that another substance may be used for the electron transporting layer as long as the electron-transporting property thereof is higher than the hole-transporting property. Note that the electron transporting layer is not limited to a single layer, and may be two or more stacked layers containing any of the above-mentioned substances.

Further, for the electron-transporting layer 216, a high molecular compound can be used. For example, poly[(9,9-dihexylfluorene-2,7-diyl)-co-(pyridine-3,5-diyl)] (abbreviation: PF-Py), poly[(9,9-dioctyllfluorene-2,7-diyl)-co-(2,2'-bipyridine-6,6'-diyl)] (abbreviation: PF-BPy), or the like can be used.

The electron-injecting layer 217 is a layer containing a substance having a high electron-injecting property. As a substance having a high electron-injecting property, an alkali metal, an alkaline earth metal, or a compound thereof such as lithium fluoride (LiF), cesium fluoride (CsF), or calcium fluoride ($CaF_2$) can be used. For example, a layer formed of a substance having an electron-transporting property which further contains an alkali metal, an alkaline earth metal, or a compound thereof; for example, a layer of Alq containing magnesium (Mg) can be used. Note that by applying the aforementioned layer to the electron-injecting layer 217, electrons can be efficiently injected from the second electrode 204, which is preferable.

As a substance for forming the second electrode 204, a metal, an alloy, an electrically conductive compound, or a mixture thereof, or the like with a low work function (specifically, a work function of 3.8 eV or lower is preferable) can be used. Specific examples of such cathode materials are given below: elements belonging to Group 1 and Group 2 of the periodic table, that is, alkali metals such as lithium (Li) and cesium (Cs) and alkaline earth metals such as magnesium (Mg), calcium (Ca), and strontium (Sr); alloys thereof (e.g., MgAg and AlLi); rare earth metals such as europium (Eu) and ytterbium (Yb); alloys thereof; and the like. A film of an alkali metal, an alkaline earth metal, or an alloy thereof can be formed by a vacuum evaporation method. In addition, a film of an alloy including an alkali metal or an alkaline earth metal can be formed by a sputtering method. Further, a film can be formed using a silver paste or the like by an inkjet method or the like.

By providing the electron-injecting layer 217 which is a layer having a function of promoting electron injection between the second electrode 204 and the electron-transporting layer 216, the second electrode 204 can be formed using various conductive materials such as Al, Ag, ITO, or indium tin oxide containing silicon or silicon oxide, regardless of their work functions. A film of such a conductive material can be formed by a sputtering method, an inkjet method, a spin coating method, or the like.

Various methods can be used for forming an EL layer, regardless of whether the method is a dry process or a wet process. For example, a vacuum evaporation method, an inkjet method, a spin coating method, or the like may be used. Further, a different film formation method may be used to form each electrode or each layer.

For example, the EL layer may be formed by a wet process using a high molecular compound selected from the above-mentioned materials. Further, the EL layer can also be formed by a wet process using a low molecular organic compound. Further, the EL layer may be formed by a dry process such as a vacuum evaporation method using a low molecular organic compound.

The electrode may also be formed by a wet process using a sol-gel method, or by a wet process using a paste of a metal material. Further, the electrode may be formed by a dry method such as a sputtering method or a vacuum evaporation method.

For example, in a case where a light-emitting element of the present invention is applied to a display device and a light-emitting layer for each color is formed separately, the light-emitting layer is preferably formed by a wet process. Formation of the light-emitting layer by an inkjet method facilitates separate formation of the light-emitting layer for each color even when a large-sized substrate is used.

In a light-emitting element of the present invention having the above-described structure, current flows due to a potential difference generated between the first electrode 202 and the second electrode 204, whereby holes and electrons are recombined in the EL layer 203 and light is emitted.

Figure 3A:
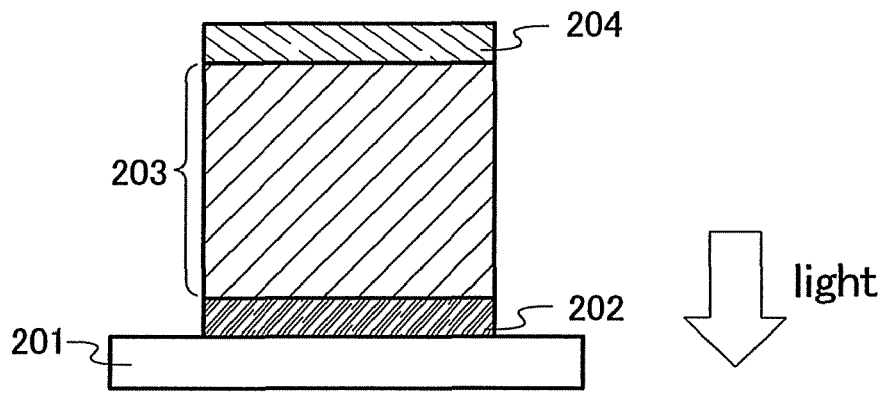
FIGS. 3A to 3C each illustrate a light-emitting element of the present invention.
Figure 3B:
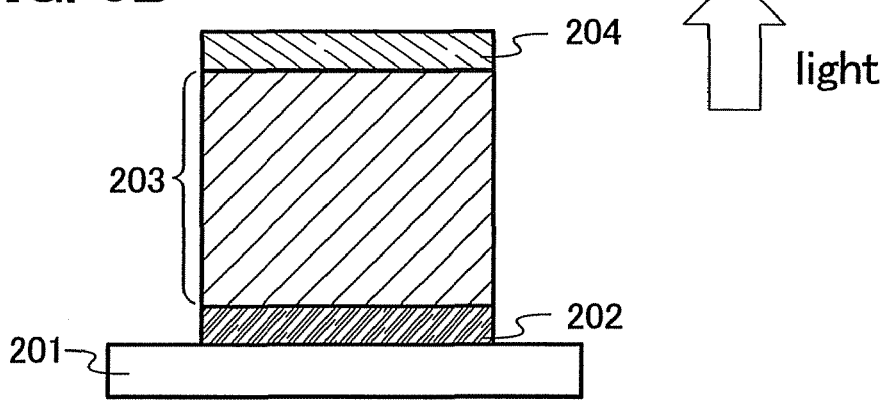
Figure 3C:
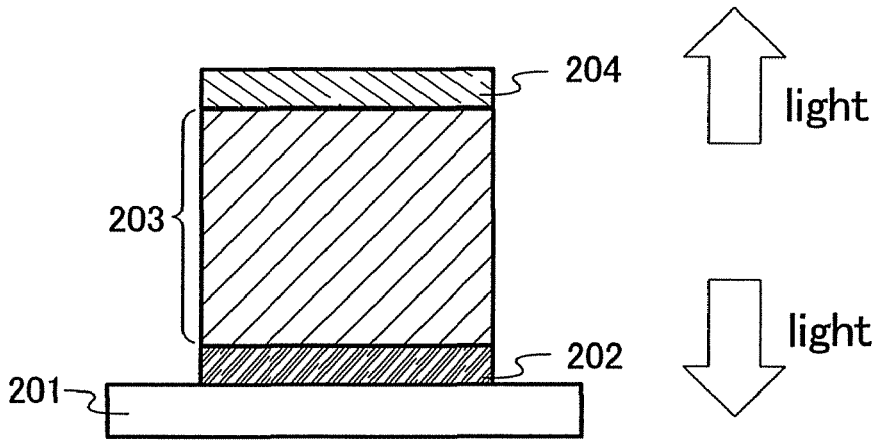

Light emission is extracted to the outside through one of or both the first electrode 202 and the second electrode 204. Accordingly, one of or both the first electrode 202 and the second electrode 204 are electrodes having a light-transmitting property. When only the first electrode 202 has a light-transmitting property, light emission is extracted from the substrate side through the first electrode 202 as illustrated in FIG. 3A. When only the second electrode 204 has a light-transmitting property, light emission is extracted from the opposite side to the substrate through the second electrode 204 as illustrated in FIG. 3B. When both the first electrode 202 and the second electrode 204 have a light-transmitting property, light emission is extracted from both the substrate side and the opposite side to the substrate through the first electrode 202 and the second electrode 204 as illustrated in FIG. 3C.

Note that the structure of the layers provided between the first electrode 202 and the second electrode 204 is not limited to the above structure. Any structure other than the above structure can be employed as long as a layer for controlling the carrier transport is provided and a light-emitting region where holes and electrons are recombined is positioned away from the first electrode 202 and the second electrode 204 so as to prevent quenching caused by proximity of the light-emitting region to metal.

That is, there is no particular limitation on the stacked structure of the layers, and a layer for controlling the carrier transport and the light-emitting layer in this embodiment mode may be combined with a layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

The layer for controlling the hole transport controls the hole transport, and therefore, is preferably provided between the light-emitting layer and the electrode serving as an anode.

Figure 1B:
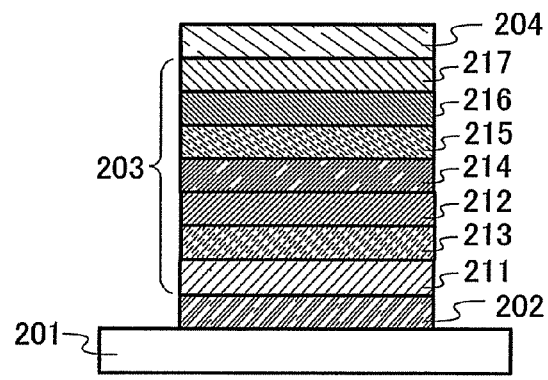
Figure 1C:
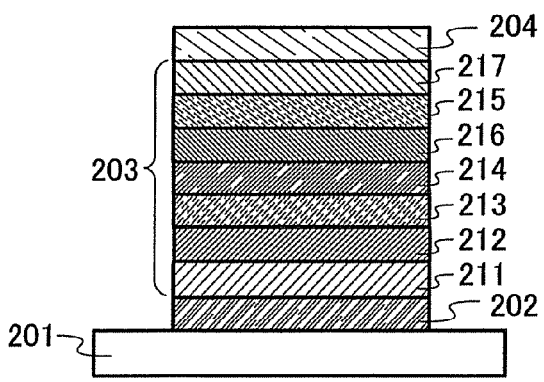

As illustrated in FIGS. 1A and 1C, in a case of a structure where the light-emitting layer 214 and the layer 213 for controlling the hole transport are in contact with each other, as the second organic compound, it is preferable to use an organic compound into which electrons are not easily injected and the band gap thereof is higher than that of an organic compound which has the highest weight percent in the light-emitting layer 214. In a case where the light-emitting layer 214 and the layer 213 for controlling the hole transport are in contact with each other, the light-emitting layer and the layer for controlling the carrier transport can be successively formed with the same mask, which is preferable in manufacturing a full-color display or the like where selective formation of the layer for controlling the carrier transport is needed for each light-emitting element because the manufacture is facilitated.

Figure 1D:
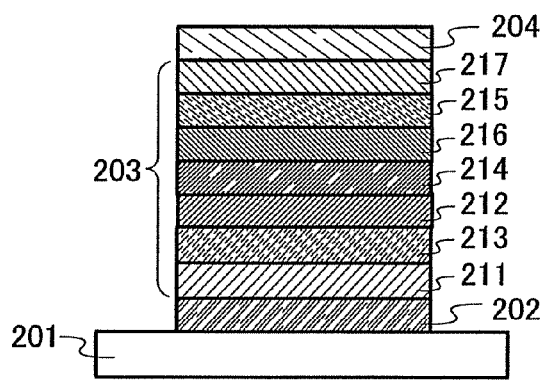
Figure 2A:
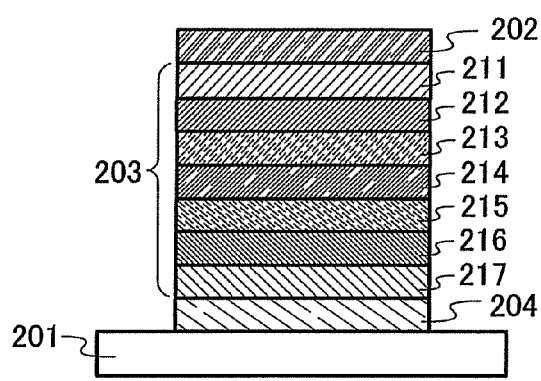
FIGS. 2A to 2D each illustrate a light-emitting element of the present invention.
Figure 2B:
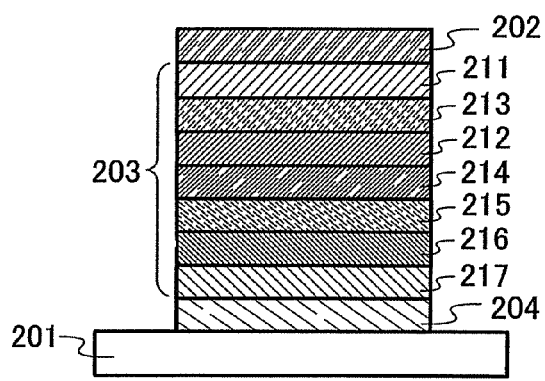
Figure 2C:
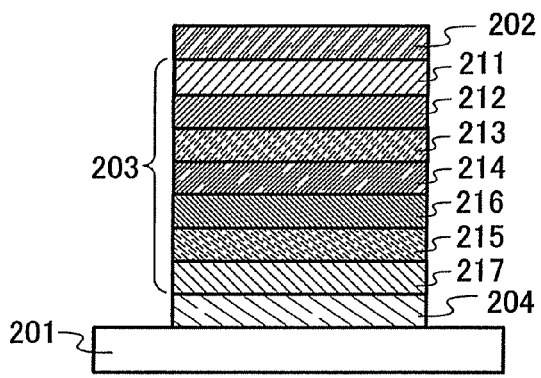
Figure 2D:
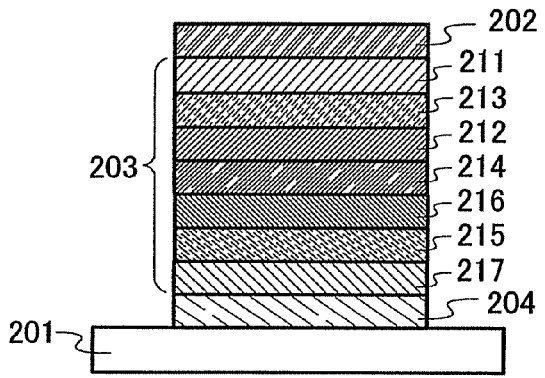

Note that as illustrated in FIGS. 1B and 1D, a structure in which a layer is formed between the light-emitting layer 214 and the layer 213 for controlling the hole transport may be employed.

The layer for controlling the electron transport controls the electron transport, and therefore, is preferably provided between the light-emitting layer and the electrode serving as a cathode. As illustrated in FIGS. 1A and 1B, a layer 215 for controlling the electron transport is more preferably provided to be in contact with the light-emitting layer 214. By providing the layer for controlling the electron transport to be in contact with the light-emitting layer, electron injection into the light-emitting layer can be directly controlled. Therefore, change in carrier balance with time in the light-emitting layer can be controlled more efficiently, whereby the lifetime of the element can be more effectively improved. In addition, the process can be simplified.

Note that the layer for controlling the electron transport is preferably provided to be in contact with the light-emitting layer, and in such a case, it is preferable that the third organic compound contained in the layer for controlling the electron transport be a different kind of an organic compound from an organic compound which has a high weight percent in the light-emitting layer. In particular, in a case where the light-emitting layer contains a substance (a fifth organic compound) for dispersing a substance having a high light-emitting property and a substance having a high light-emitting property (a sixth organic compound), the kinds of the fifth organic compound and the third organic compound are preferably different from each other. In such a structure, the electron transport from the layer for controlling the electron transport to the light-emitting layer is suppressed also between the third organic compound and the fifth organic compound, and thus effect of providing the layer for controlling the electron transport is further increased.

As illustrated in FIGS. 1C and 1D, a layer may be formed between the light-emitting layer 214 and the layer 215 for controlling the electron transport.

In addition, as in FIGS. 2A to 2D, a structure in which the second electrode 204 serving as a cathode, the EL layer 203, and the first electrode 202 serving as an anode are stacked in that order over the substrate 201 may be employed. The light-emitting element in FIG. 2A has a structure in which the layers of the EL layer in FIG. 1A are stacked in the reverse order, the light-emitting element in FIG. 2B has a structure in which the layers of the EL layer in FIG. 1B are stacked in the reverse order, the light-emitting element in FIG. 2C has a structure in which the layers of the EL layer in FIG. 1C are stacked in the reverse order, and the light-emitting element in FIG. 2D has a structure in which the layers of the EL layer in FIG. 1D are stacked in the reverse order.

Note that in this embodiment mode, the light-emitting element is formed over a substrate made of glass, plastic, or the like. By forming a plurality of such light-emitting elements over a substrate, a passive matrix light-emitting device can be manufactured. Further, for example, thin film transistors (TFTs) may be formed over a substrate made of glass, plastic, or the like so that light-emitting elements are manufactured over electrodes which are electrically connected to the TFTs. Thus, an active matrix light-emitting device which controls the driving of a light-emitting element by a TFT can be manufactured. Note that a structure of the TFT is not particularly limited, and either a staggered TFT or an inverted staggered TFT may be used. In addition, a driving circuit formed over a TFT substrate may be formed using an N-channel TFT and a P-channel TFT, or may be formed using either an N-channel TFT or a P-channel TFT. In addition, the crystallinity of a semiconductor film used for the TFT is not particularly limited. Either an amorphous semiconductor film or a crystalline semiconductor film may be used for the TFT. Further, a single crystal semiconductor film may be used. A single crystal semiconductor film can be formed by a Smart Cut (registered trademark) method or the like.

As described above, the light-emitting element in this embodiment mode is characterized by having both the layer 213 for controlling the hole transport and the layer 215 for controlling the electron transport.

For example, in a conventional light-emitting element where the layer 213 for controlling the hole transport and the layer 215 for controlling the electron transport are not provided, holes injected from the first electrode 202 pass through the hole-injecting layer 211 and the hole-transporting layer 212 to be injected into the light-emitting layer 214 without the transport being retarded; therefore, some of the holes reach the vicinity of the interface between the light-emitting layer and the electron-transporting layer 216. If holes reach the electron-transporting layer 216, the electron-transporting layer 216 may be deteriorated. If the number of holes which reach the electron-transporting layer 216 is increased with time due to the deterioration, the recombination probability in the light-emitting layer 214 is reduced with time, which results in reduction in element lifetime (luminance decay with time). Similarly, electrons injected from the second electrode 204 pass through the electron-injecting layer 217 and the electron-transporting layer 216 to be injected into the light-emitting layer 214 without the transport being retarded; therefore, some of the electrons reach the vicinity of the interface between the hole-transporting layer 212 and the light-emitting layer 214. If electrons reach the hole-transporting layer 212, the hole-transporting layer 212 may be deteriorated. If the number of electrons which reach the hole-transporting layer 212 is increased with time due to the deterioration, the recombination probability in the light-emitting layer 214 is reduced with time, which results in reduction in element lifetime (luminance decay with time).

On the other hand, as for a light-emitting element of the present invention, by providing the layer 213 for controlling the hole transport, holes injected from the first electrode 202 pass through the hole-injecting layer 211 and the hole-transporting layer 212 to be injected into the layer 213 for controlling the hole transport. The transport of the holes injected into the layer 213 for controlling the hole transport is retarded, and hole injection into the light-emitting layer 214 is controlled. As a result, holes become less likely to reach the electron-transporting layer 216 and deteriorate the electron-transporting layer 216. Note that it is important in the present invention that an organic compound which reduces a hole-transporting property is added to an organic compound having a hole-transporting property, instead of just applying a substance with low hole mobility in the layer 213 for controlling the hole transport. With such a structure, in addition to just controlling hole injection into the light-emitting layer, change in the quantity of controlled hole injection with time can be suppressed.

Further, in a light-emitting element of the present invention, the layer 215 for controlling the electron transport is also provided. Thus, electrons injected from the second electrode 204 pass through the electron-injecting layer 217 and the electron-transporting layer 216 to be injected into the layer 215 for controlling the electron transport. Here, the layer 215 for controlling the electron transport has a structure in which the fourth organic compound having a hole-transporting property is added to the third organic compound having an electron-transporting property. Therefore, the transport of the electrons injected into the layer 215 for controlling the electron transport is retarded, and electron injection into the light-emitting layer 214 is controlled. As a result, electrons become less likely to reach the hole-transporting layer 212 and deteriorate the hole-transporting layer 212. Similarly, as for holes, holes become further less likely to reach and deteriorate the electron-transporting layer 216 because the layer 215 for controlling the electron transport includes the third organic compound having an electron-transporting property. Note that it is important in the present invention that an organic compound which reduces an electron-transporting property is added to an organic compound having an electron-transporting property, instead of just applying a substance with low electron mobility in the layer 215 for controlling the electron transport. With such a structure, in addition to just controlling electron injection into the light-emitting layer 214, change in the quantity of controlled electron injection with time can be suppressed.

Therefore, by controlling the quantity of injection of both carriers of holes and electrons into the light-emitting layer, a light-emitting element according to the present invention can prevent a phenomenon that carrier balance is lost and recombination probability is reduced with time. Thus, the lifetime of the element can be improved (luminance decay with time can be suppressed).

Further, as an effect of the layer 213 for controlling the hole transport, improvement in light emission efficiency can be given. In a conventional element where the layer 213 for controlling the hole transport is not provided, most of the holes injected from the first electrode 202 are injected into the light-emitting layer 214 without the transport being controlled. If the light-emitting layer 214 has an electron-transporting property, that is, if the material which has the highest weight percent in the light-emitting layer 214 has an electron-transporting property, a light-emitting region is formed in the vicinity of the interface between the light-emitting layer 214 and the hole-transporting layer 212. In addition, there is a possibility that cations are generated by excessive holes in the vicinity of the interface between the light-emitting layer 214 and the hole-transporting layer 212. Since a cation serves as a quencher, light emission efficiency decreases due to cations generated in the vicinity of the light-emitting region.

However, by providing the layer 213 for controlling the hole transport described in this embodiment mode, formation of cations generated by excessive holes in the light-emitting layer 214 and in the vicinity of the light-emitting layer 214 can be suppressed, and decrease in light emission efficiency can be suppressed. Accordingly, a light-emitting element with high light emission efficiency can be obtained.

As described above, the light-emitting element in this embodiment mode has a layer for controlling the carrier transport. Since the layer for controlling the carrier transport contains two or more kinds of substances, carrier balance can be controlled precisely by control of combination, the mixture ratio, the film thickness, or the like of the substances.

Further, since the carrier balance can be controlled by controlling combination, the mixture ratio, the film thickness, or the like of the substances, control of the carrier balance can be easier than a conventional light-emitting element. That is, even if a physical property of the substance itself is not changed, the carrier transport can be controlled by controlling the mixture ratio, the film thickness, or the like.

Among two or more kinds of substances contained in the layer for controlling the carrier transport, an organic compound which has a lower weight percent than another substance is used for controlling the carrier transport. That is, the carrier transport can be controlled by a component which has a lower weight percent than another component contained in the layer for controlling the carrier transport. Therefore, a light-emitting element with a long lifetime, which does not easily deteriorate with time, can be realized. In other words, carrier balance hardly changes as compared with the case where the carrier balance is controlled by a single substance. For example, if the carrier transport is controlled by a layer formed of a single substance, the balance of the whole layer is changed by partial change in morphology, partial crystallization, or the like; therefore, the layer easily deteriorates with time. However, as described in this embodiment mode, by controlling the carrier transport by a component which has a lower weight percent than another component contained in the layer for controlling the carrier transport, an effect of change in morphology, crystallization, aggregation, or the like is reduced, and thus, deterioration with time is hardly caused. Thus, a light-emitting element with a long lifetime can be obtained in which light emission efficiency hardly decreases with time.

Moreover, by controlling the carrier transport at opposite sides of the light-emitting layer, an effect of change in morphology, crystallization, aggregation, or the like is further reduced, and thus, a light-emitting element with a long lifetime can be obtained in which light emission efficiency hardly decreases with time in which deterioration with time is hardly caused and light emission efficiency hardly decreases with time can be obtained.

In addition, by controlling the carrier transport at opposite sides of the light-emitting layer, a light-emitting element with a long lifetime can be obtained without depending on a carrier-transporting property of the light-emitting layer. Therefore, a material for the light-emitting layer can be chosen from a wider range, and the light-emitting element can be designed more flexibly.

Note that this embodiment mode can be combined with another embodiment mode as appropriate.

Embodiment Mode 2

In this embodiment mode, a mode of a light-emitting element in which a plurality of light-emitting units according to the present invention are stacked (hereinafter this light-emitting element is referred to as a stacked-type light-emitting element) will be described with reference to FIG. 6. This light-emitting element is a stacked-type light-emitting element including a plurality of light-emitting units between a first electrode and a second electrode. Each structure of the light-emitting units can be similar to the structure described in Embodiment Mode 1. In other words, the light-emitting element described in Embodiment Mode 1 is a light-emitting element having one light-emitting unit. In this embodiment mode, a light-emitting element having a plurality of light-emitting units will be described.

Figure 6:
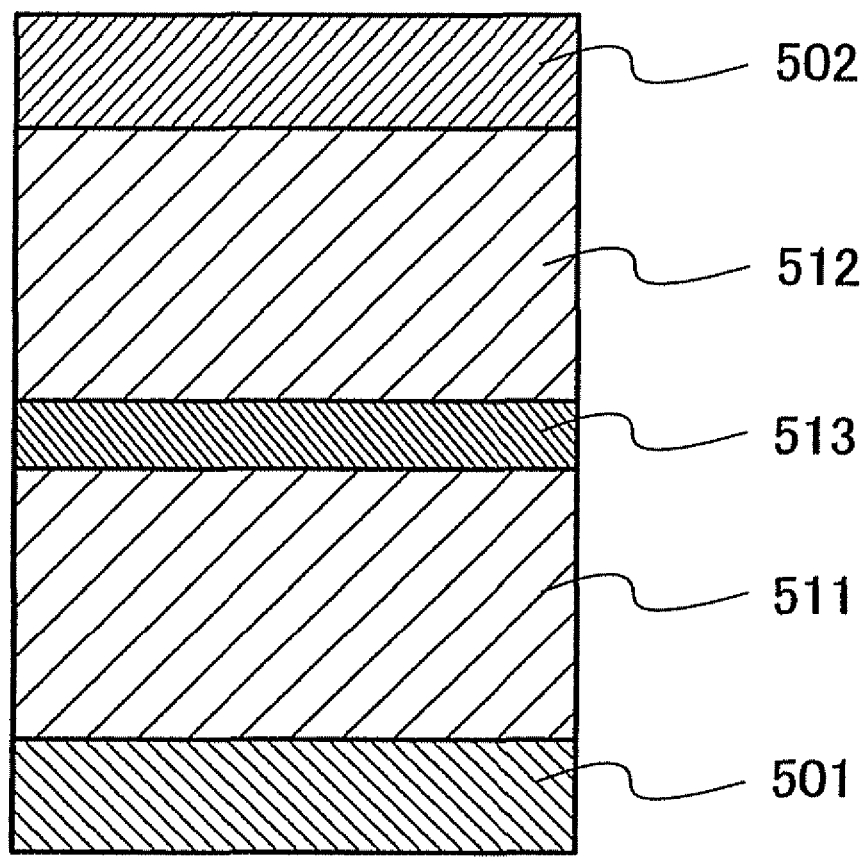
FIG. 6 illustrates a light-emitting element of the present invention.

In FIG. 6, a first light-emitting unit 511 and a second light-emitting unit 512 are stacked between a first electrode 501 and a second electrode 502. As the first electrode 501 and the second electrode 502, similar electrodes to the electrode described in Embodiment Mode 1 can be employed. Note that the first light-emitting unit 511 and the second light-emitting unit 512 may have the same structure or different structures, and as the structures, a similar structure to the structure in Embodiment Mode 1 can be employed.

A charge generation layer 513 contains a composite material in which a substance having an acceptor property is mixed into an organic compound. This composite material of an organic compound and a substance having an acceptor property is the composite material described in Embodiment Mode 1 and contains 7,7,8,8-tetracyano-2,3,5,6-tetrafluoro-quinodimethane (abbreviation: $F_4$-TCNQ), or metal oxide such as vanadium oxide, molybdenum oxide, or tungsten oxide as a substance having an acceptor property. As an organic compound, any of various compounds such as an aromatic amine compound, a carbazole derivative, an aromatic hydrocarbon, a high molecular compound, an oligomer, a dendrimer, or a polymer can be used. Note that the organic compound having a hole mobility of $10^{-6}$ $cm^2/Vs$ or higher is preferably employed as an organic compound. However, another substance may also be used as long as the hole-transporting property thereof is higher than the electron-transporting property. A composite of an organic compound and metal oxide is superior in a carrier-injecting property and a carrier-transporting property, and accordingly, low-voltage driving and low-current driving can be realized Note that the charge generation layer 513 may be formed with a combination of the composite material of an organic compound and a substance having an acceptor property, and another material. For example, the charge generation layer 513 may be formed with a combination of a layer containing the composite material of an organic compound and metal oxide, and a layer containing one compound selected from substances having an electron-donating property and a compound having a high electron-transporting property. Further, the charge generation layer 513 may be formed with a combination of a layer containing the composite material of an organic compound and metal oxide, and a transparent conductive film. Furthermore, electrode materials described in Embodiment Mode 1 can be used for the charge generation layer. Note that a layer having a high light-transmitting property is preferably used as the charge generation layer in terms of light extraction efficiency.

In any case, the charge generation layer 513 interposed between the first light-emitting unit 511 and the second light-emitting unit 512 is acceptable as long as electrons are injected into a light-emitting unit on one side and holes are injected into a light-emitting unit on the other side when voltage is applied to the first electrode 501 and the second electrode 502. For example, in the case of applying voltage so that potential of the first electrode is higher than potential of the second electrode, any structure is acceptable for the charge generation layer 513 as long as the charge generation layer 513 injects electrons and holes into the first light-emitting unit 511 and the second light-emitting unit 512, respectively.

Although the light-emitting element having two light-emitting units is described in this embodiment mode, a light-emitting element in which three or more light-emitting units are stacked can be employed in a similar way. Like the light-emitting element of this embodiment mode, by disposing a plurality of light emitting units between a pair of electrodes so as to be partitioned with the charge generation layer, the element with a long lifetime in a high luminance region can be realized while keeping low current density. In the case where the light-emitting element is applied to lighting as an application example, voltage drop due to resistance of an electrode material can be reduced. Accordingly, light can be uniformly emitted in a large area. Moreover, a light-emitting device of low power consumption, which can be driven at low voltage, can be achieved.

The light-emitting units emit light of different colors from each other, thereby obtaining light emission of a desired color as the whole light-emitting element. For example, in a light-emitting element having two light-emitting units, by making the emission colors of the first light-emitting unit and the second light-emitting unit complementary colors, the light-emitting element which emits white light as the whole element can be obtained. Note that complementary colors refer to colors which can produce an achromatic color when mixed. That is, white light emission can be obtained by mixing light obtained from substances emitting light of complementary colors. The same can be applied to a light-emitting element having three light-emitting units. For example, when the first light-emitting unit emits red light, the second light-emitting unit emits green light, and the third light-emitting unit emits blue light, white light can be emitted as the whole light-emitting element.

Note that this embodiment mode can be combined with another embodiment mode as appropriate.

Embodiment Mode 3

In this embodiment mode, a light-emitting device having a light-emitting element of the present invention will be described.

Figure 7A:
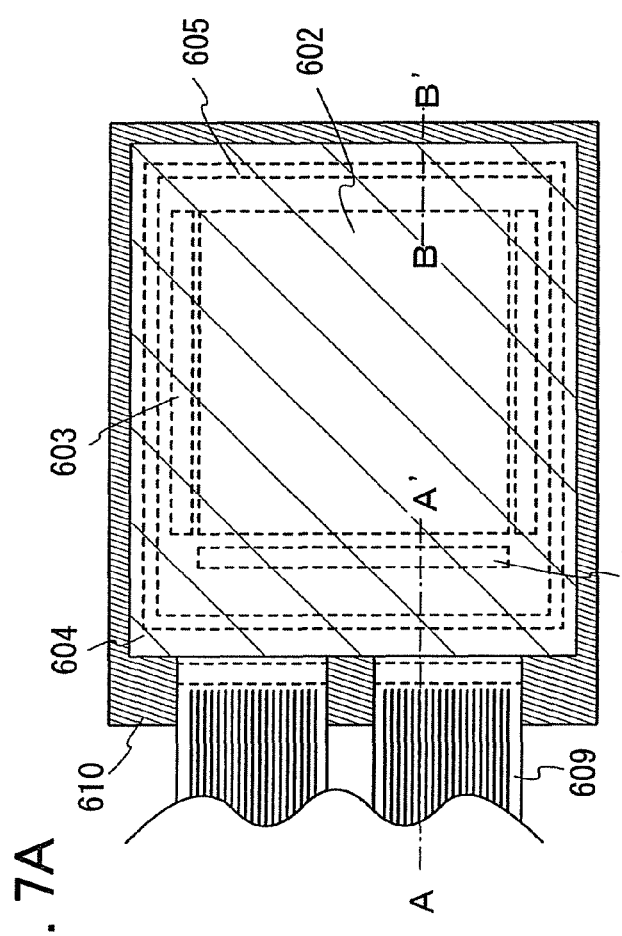
FIGS. 7A and 7B illustrate a light-emitting device of the present invention.
Figure 7B:
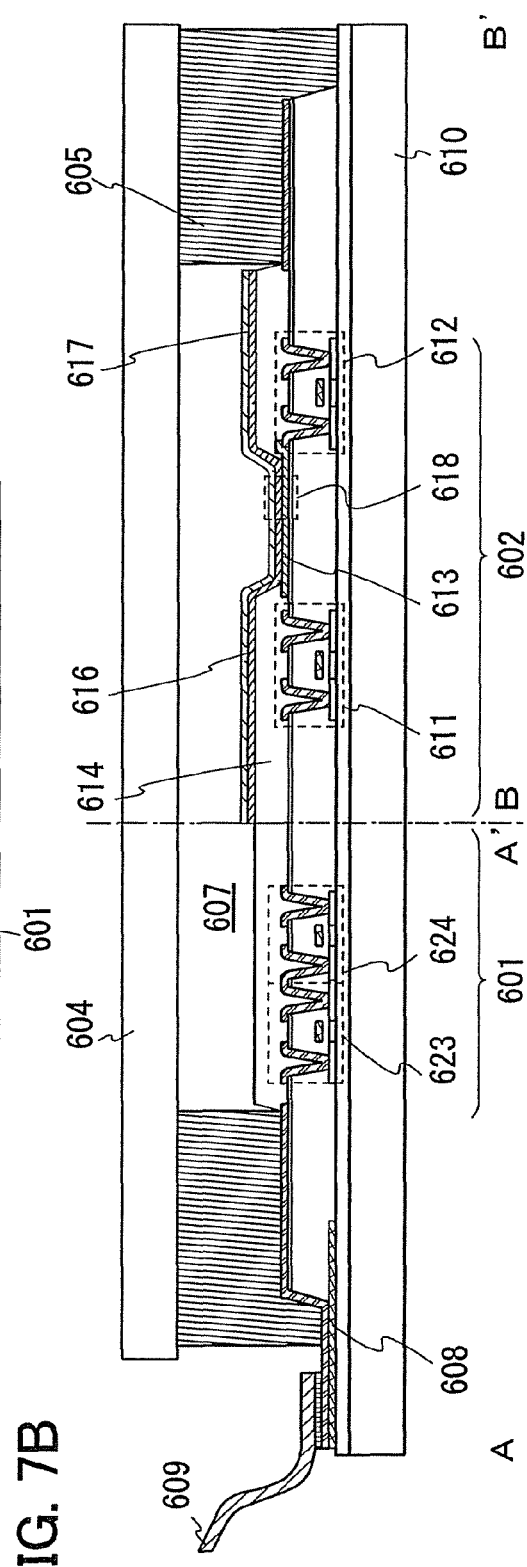

A light-emitting device having a light-emitting element of the present invention in a pixel portion is described in this embodiment mode with reference to FIGS. 7A and 7B. Note that FIG. 7A is a top view illustrating the light-emitting device and FIG. 7B is a cross-sectional view of FIG. 7A taken along lines A-A' and B-B'. This light-emitting device includes a driver circuit portion (source side driver circuit) 601, a pixel portion 602, and a driver circuit portion (gate side driver circuit) 603, which are indicated by dotted lines, in order to control the light emission of the light-emitting element. Further, reference numeral 604 indicates a sealing substrate and reference numeral 605 indicates a sealing material. A space 607 is a portion surrounded by the sealing material 605.

Note that a leading wiring 608 is a wiring for transmitting signals input in the source side driver circuit 601 and the gate side driver circuit 603. The leading wiring 608 receives video signals, clock signals, start signals, reset signals and the like from a flexible printed circuit (FPC) 609 that serves as an external input terminal. Although only an FPC is illustrated here, this FPC may be provided with a printed wiring board (PWB). The light-emitting device in this specification refers to not only a light-emitting device itself but also to a state in which an FPC or a PWB is attached to a light-emitting device.

Then, a cross-sectional structure is described with reference to FIG. 7B. While the driver circuit portion and the pixel portion are provided over an element substrate 610, FIG. 7B only illustrates the source side driver circuit 601, which is the driver circuit portion, and one pixel of the pixel portion 602.

Note that a CMOS circuit which is a combination of an N-channel TFT 623 and a P-channel TFT 624 is provided in the source side driver circuit 601. The driver circuit may be formed by various CMOS circuits, PMOS circuits, or NMOS circuits. In this embodiment mode, a driver-integrated type in which a driver circuit is formed over a substrate is described; however, the present invention is not limited to this, and the driver circuit can be formed outside the substrate.

The pixel portion 602 includes a plurality of pixels each having a switching TFT 611, a current controlling TFT 612, and a first electrode 613 that is electrically connected to a drain of the current controlling TFT 612. Note that an insulator 614 is formed to cover the edge of the first electrode 613. Here, a positive photosensitive acrylic resin film is used to form the insulator 614.

Further, in order to improve the coverage, the insulator 614 is provided such that either an upper edge portion or a lower edge portion of the insulator has a curved surface with a curvature. For example, when positive photosensitive acrylic is used as a material for the insulator 614, it is preferable that only an upper edge portion of the insulator 614 have a curved surface with a radius of curvature (0.2 µm to 3 µm). The insulator 614 can be formed using either a negative type that becomes insoluble in an etchant by light irradiation, or a positive type that becomes dissoluble in an etchant by light irradiation.

An EL layer 616 and a second electrode 617 are formed over the first electrode 613. Here, various metals, alloys, electrically conductive compounds, or mixtures thereof can be used for a material of the first electrode 613. If the first electrode is used as an anode, it is preferable that the first electrode be formed using a metal, an alloy, an electrically conductive compound, a mixture thereof with a high work function (a work function of 4.0 eV or higher) among such materials. For example, the first electrode 613 can be formed using a single-layer film such as an indium tin oxide film containing silicon, an indium zinc oxide film, a titanium nitride film, a chromium film, a tungsten film, a Zn film, a Pt film, or the like; a stacked film of a titanium nitride film and a film containing aluminum as its main component; or a three-layer structure of a titanium nitride film, a film containing aluminum as its main component, and a titanium nitride film. Note that when a stacked structure is employed, the first electrode 613 has low resistance as a wiring, forms a favorable ohmic contact, and can serve as an anode.

The EL layer 616 is formed by various methods such as an evaporation method using an evaporation mask, an inkjet method, a spin coating method, or the like. The EL layer 616 includes the layer for controlling the carrier transport described in Embodiment Mode 1 or Embodiment Mode 2. Any of a low molecular compound, a high molecular compound, an oligomer, or a dendrimer may be employed as a material for the EL layer 616. As the material for the EL layer, not only an organic compound but also an inorganic compound may be used.

As the material for the second electrode 617, various types of metals, alloys, electrically conductive compounds, mixtures thereof, or the like can be used. If the second electrode is used as a cathode, it is preferable that the second electrode be formed using an alloy, an electrically conductive compound, a mixture thereof with a high work function (a work function of 3.8 eV or higher) among such materials. For example, elements belonging to Group 1 and Group 2 of the periodic table, that is, alkali metals such as lithium (Li) and cesium (Cs) and alkaline earth metals such as magnesium (Mg), calcium (Ca), and strontium (Sr); alloys thereof (e.g., MgAg and AlLi), and the like can be given. In the case where light generated in the EL layer 616 is transmitted through the second electrode 617, the second electrode 617 may also be formed by using a stacked layer of a thin metal film with a reduced film thickness and a transparent conductive film (indium tin oxide (ITO), indium tin oxide containing silicon or silicon oxide, indium zinc oxide (IZO), indium oxide containing tungsten oxide and zinc oxide (IWZO), or the like).

By attaching the sealing substrate 604 to the element substrate 610 with the sealing material 605, the light-emitting element 618 is provided in the space 607 which is surrounded by the element substrate 610, the sealing substrate 604, and the sealing material 605. Note that the space 607 may be filled with a filler, and may be filled with an inert gas (such as nitrogen and argon), the sealing material 605, or the like.

As the sealing material 605, an epoxy-based resin is preferably used. In addition, it is desirable to use a material that allows permeation of moisture or oxygen as little as possible. As the sealing substrate 604, a plastic substrate formed of fiberglass-reinforced plastics (FRP), polyvinyl fluoride (PVF), polyester, acrylic, or the like can be used as well as a glass substrate or a quartz substrate.

As described above, the light-emitting device having a light-emitting element of the present invention can be obtained.

A light-emitting device of the present invention has the light-emitting element described in Embodiment Mode 1 or Embodiment Mode 2. Thus, a light-emitting device with high light emission efficiency can be obtained.

In addition, since the light-emitting element with high light emission efficiency is included, a light-emitting device with low power consumption can be obtained.

Further, since a light-emitting element with less deterioration and a long lifetime is included, a light-emitting device with a long lifetime can be obtained.

Figure 8A:
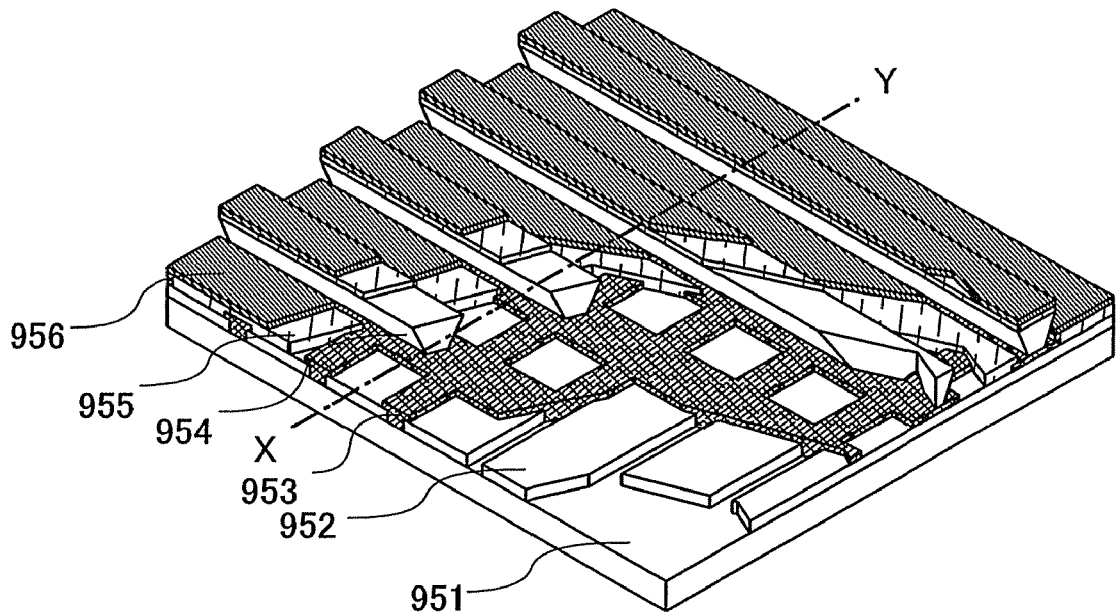
FIGS. 8A and 8B illustrate a light-emitting device of the present invention.
Figure 8B:
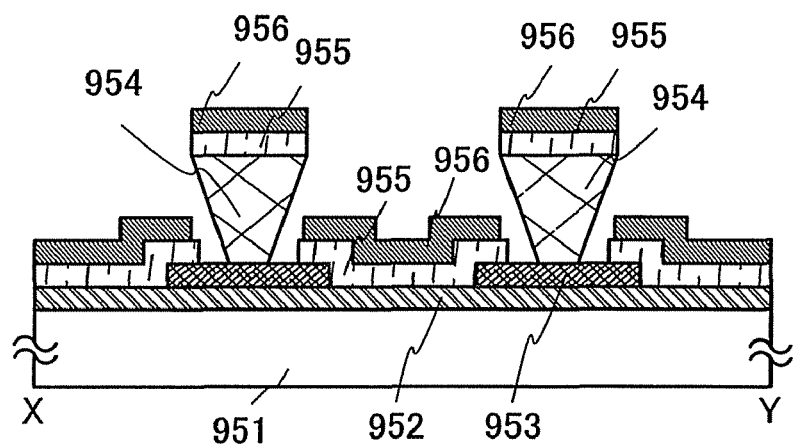

An active matrix light-emitting device that controls driving of a light-emitting element with a transistor is described above in this embodiment mode; however, a passive matrix light-emitting device may be used. FIGS. 8A and 8B illustrate a passive matrix light-emitting device manufactured according to the present invention. Note that FIG. 8A is a perspective view of the light-emitting device and FIG. 8B is a cross-sectional view taken along a line X-Y in FIG. 8A. In FIGS. 8A and 8B, an EL layer 955 is provided between an electrode 952 and an electrode 956 over a substrate 951. The edge of the electrode 952 is covered with an insulating layer 953. A partition layer 954 is provided over the insulating layer 953. The sidewalls of the partition layer 954 slope so that the distance between one sidewall and the other sidewall is gradually reduced toward the surface of the substrate. In other words, the partition layer 954 is fabricated so that a lower side (a side in contact with the insulating layer 953) is shorter than an upper side (an opposite side of the side in contact with the insulating layer 953) as illustrated in a cross-sectional view in FIG. 8B. The EL layer 955 and the electrode 956 can be patterned by providing the partition layer 954 in this manner. In addition, in a passive matrix light-emitting device, a light-emitting device with high light emission efficiency can be obtained by including a light-emitting element with high light emission efficiency of the present invention.

A light-emitting device of the present invention has the light-emitting element described in Embodiment Mode 1 or Embodiment Mode 2. Thus, a light-emitting device with high light emission efficiency can be obtained.

In addition, since the light-emitting element with high light emission efficiency is included, a light-emitting device with low power consumption can be obtained.

Further, since a light-emitting element with less deterioration and a long lifetime is included, a light-emitting device with a long lifetime can be obtained.

Note that this embodiment mode can be combined with another embodiment mode as appropriate.

Embodiment Mode 4

In this embodiment mode, an electronic device of the present invention which includes the light-emitting device described in Embodiment Mode 3 will be described. An electronic device of the present invention has the light-emitting element described in Embodiment Mode 1 or Embodiment Mode 2, and thus has a display portion with high light emission efficiency and low power consumption. In addition, the display portion has a long lifetime.

As an electronic device manufactured using a light-emitting device of the present invention, cameras such as a video camera and a digital camera, a goggle type display, a navigation system, an audio reproducing device (a car audio set, an audio component set, or the like), a computer, a game machine, a portable information terminal (a mobile computer, a cellular phone, a portable game machine, an electronic book reader, or the like), an image reproducing device provided with a recording medium (specifically, a device provided with a display device that can reproduce a recording medium and display the image such as a digital versatile disc (DVD)), and the like are given. Specific examples of these electronic devices are illustrated in FIGS. 9A to 9D.

Figure 9A:
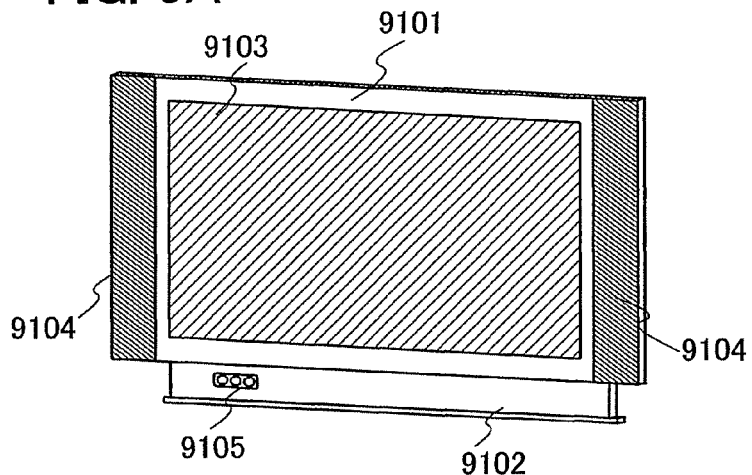
FIGS. 9A to 9D each illustrate an electronic device of the present invention.

FIG. 9A illustrates a television device of this embodiment mode that includes a housing 9101, a support 9102, a display portion 9103, speaker portions 9104, a video input terminal 9105, and the like. In the display portion 9103 of this television device, light-emitting elements similar to those described in Embodiment Modes 1 or Embodiment Mode 2 are arranged in matrix. One feature of the light-emitting element is that light emission efficiency is high and power consumption is low. Further, the light-emitting element has a long lifetime. The display portion 9103 which includes the light-emitting element has similar features. Therefore, in this television device, image quality is hardly deteriorated and low power consumption is achieved. With such features, deterioration compensation function and a power supply circuit can be significantly reduced or downsized in the television device; therefore, reduction in size and weight of the housing 9101 and the support 9102 can be achieved. In the television device of this embodiment mode, low power consumption, high image quality, and reduction in size and weight are achieved; therefore, a product which is suitable for living environment can be provided.

Figure 9B:
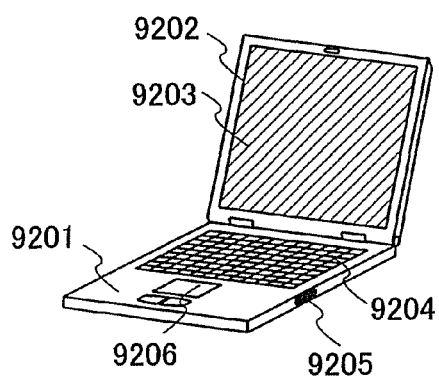

FIG. 9B illustrates a computer of this embodiment mode that includes a main body 9201, a housing 9202, a display portion 9203, a keyboard 9204, an external connection port 9205, a pointing device 9206, and the like. In the display portion 9203 of this computer, light-emitting elements similar to those described in Embodiment Modes 1 or Embodiment Mode 2 are arranged in matrix. One feature of the light-emitting element is that light emission efficiency is high and power consumption is low. Further, the light-emitting element has a long lifetime. The display portion 9203 which includes the light-emitting elements has similar features. Therefore, in the computer, image quality is hardly deteriorated and lower power consumption is achieved. With such features, deterioration compensation function and a power supply circuit can be significantly reduced or downsized in the computer; therefore, reduction in size and weight of the main body 9201 and the housing 9202 can be achieved. In the computer of this embodiment mode, low power consumption, high image quality, and reduction in size and weight are achieved; therefore, a product which is suitable for environment can be provided. Moreover, the computer can be carried and the computer having the display portion which has strong resistance to external impact when being carried can be provided.

Figure 9C:
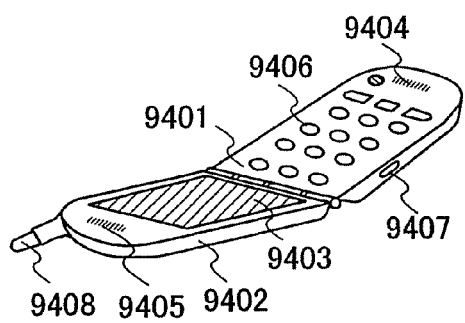

FIG. 9C illustrates a cellular phone of this embodiment mode that includes a main body 9401, a housing 9402, a display portion 9403, an audio input portion 9404, an audio output portion 9405, operation keys 9406, an external connection port 9407, an antenna 9408, and the like. In the display portion 9403 of this cellular phone, light-emitting elements similar to those described in Embodiment Modes 1 or Embodiment Mode 2 are arranged in matrix. One feature of the light-emitting element is that light emission efficiency is high and power consumption is low. Further, the light-emitting element has a long lifetime. The display portion 9403 which includes the light-emitting elements has similar features. Therefore, in the cellular phone, image quality is hardly deteriorated and lower power consumption is achieved. With such features, deterioration compensation function and a power supply circuit can be significantly reduced or downsized in the cellular phone; therefore, reduction in size and weight of the main body 9401 and the housing 9402 can be achieved. In the cellular phone of this embodiment mode, low power consumption, high image quality, and reduction in size and weight are achieved; therefore, a product which is suitable for being carried can be provided. Further, the present invention can provide a product, a display portion of which is resistant to impact even when being carried.

Figure 9D:
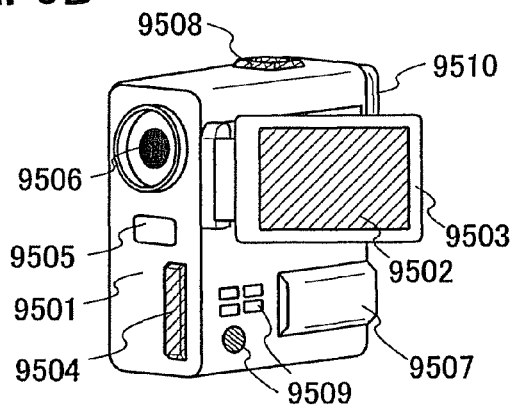

FIG. 9D illustrates a camera that includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In the display portion 9502 of this camera, light-emitting elements similar to those described in Embodiment Modes 1 or Embodiment Mode 2 are arranged in matrix. One feature of the light-emitting element is that light emission efficiency is high and power consumption is low. Further, the light-emitting element has a long lifetime. The display portion 9502 which includes the light-emitting elements has similar features. Therefore, in the camera, image quality is hardly deteriorated and lower power consumption is achieved. With such features, deterioration compensation function and a power supply circuit can be significantly reduced or downsized in the camera, thereby achieving reduction in size and weight of the main body 9501. In the camera of this embodiment mode, low power consumption, high image quality, and reduction in size and weight are achieved; therefore, a product which is suitable for being carried can be provided. Further, the present invention can provide a product, a display portion of which is resistant to impact even when being carried.

Figure 10:
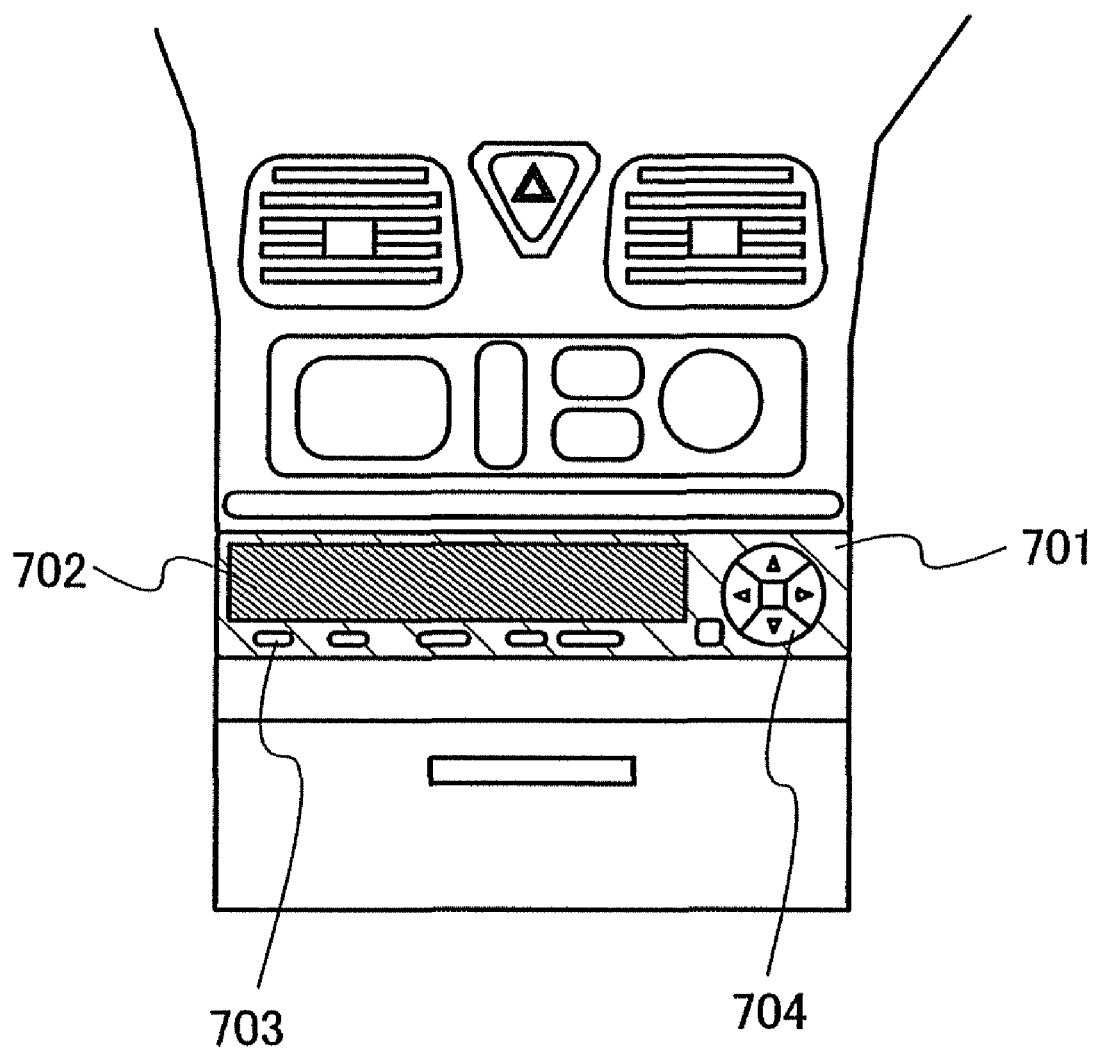
FIG. 10 illustrates an electronic device of the present invention.

FIG. 10 illustrates an audio reproducing device, specifically, a car audio system. The audio reproducing device includes a main body 701, a display portion 702, and operation switches 703 and 704. The display portion 702 can be realized by the light-emitting device (passive matrix or active matrix) described in Embodiment Mode 2. Further, the display portion 702 may be formed using a segment type light-emitting device. In any case, the use of a light-emitting element of the present invention makes it possible to form a bright display portion with a long lifetime while achieving low power consumption which uses a vehicle power source (12 to 42 V). Further, although this embodiment mode describes an in-car audio system, a light-emitting device of the present invention may also be used in portable audio systems or audio systems for home use.

Figure 11:
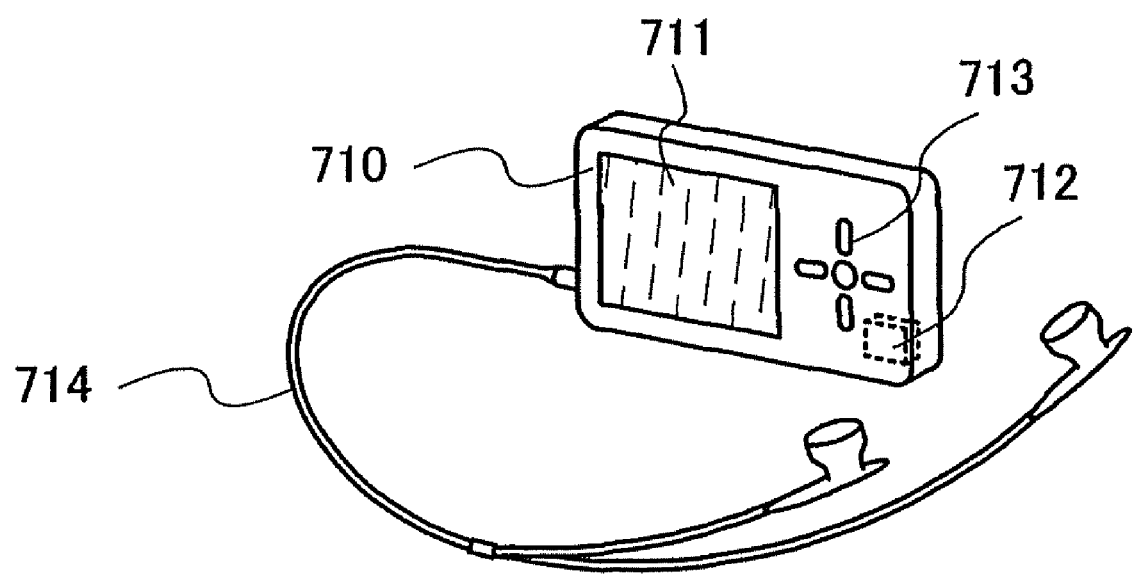
FIG. 11 illustrates an electronic device of the present invention.

FIG. 11 illustrates a digital player as one example of that. The digital player illustrated in FIG. 11 includes a main body 710, a display portion 711, a memory portion 712, an operation portion 713, earphones 714, and the like. Note that a pair of headphones or a pair of wireless earphones can be used instead of the pair of earphones 714. The display portion 711 can be realized by the light-emitting device (passive matrix or active matrix) described in Embodiment Mode 2. Further, the display portion 711 may be formed using a segment type light-emitting device. In any case, by using a light-emitting element of the present invention, a display portion can be formed that is capable of displaying images even when using a secondary battery (a nickel-hydrogen battery or the like), has a long lifetime, is bright, and achieves low power consumption. As the memory portion 712, a hard disk or a nonvolatile memory is used. For example, a NAND type nonvolatile memory with a recording capacity of 20 to 200 gigabytes (GB) is used, and by operating the operation portion 713, an image or a sound (music) can be recorded and reproduced. Note that in the display portion 711, white characters are displayed against a black background, and thus, power consumption can be reduced. This is particularly effective for portable audio systems.

As described above, the applicable range of the light-emitting device manufactured by applying the present invention is so wide that the light-emitting device is applicable to electronic devices in various fields. By applying the present invention, an electronic device which has a display portion consuming low power and having high reliability can be manufactured.

A light-emitting device to which the present invention is applied has a light-emitting element with high light emission efficiency, and can also be used as a lighting device. One mode of using a light-emitting element according to the present invention as a lighting device is described with reference to FIG. 12.

Figure 12:
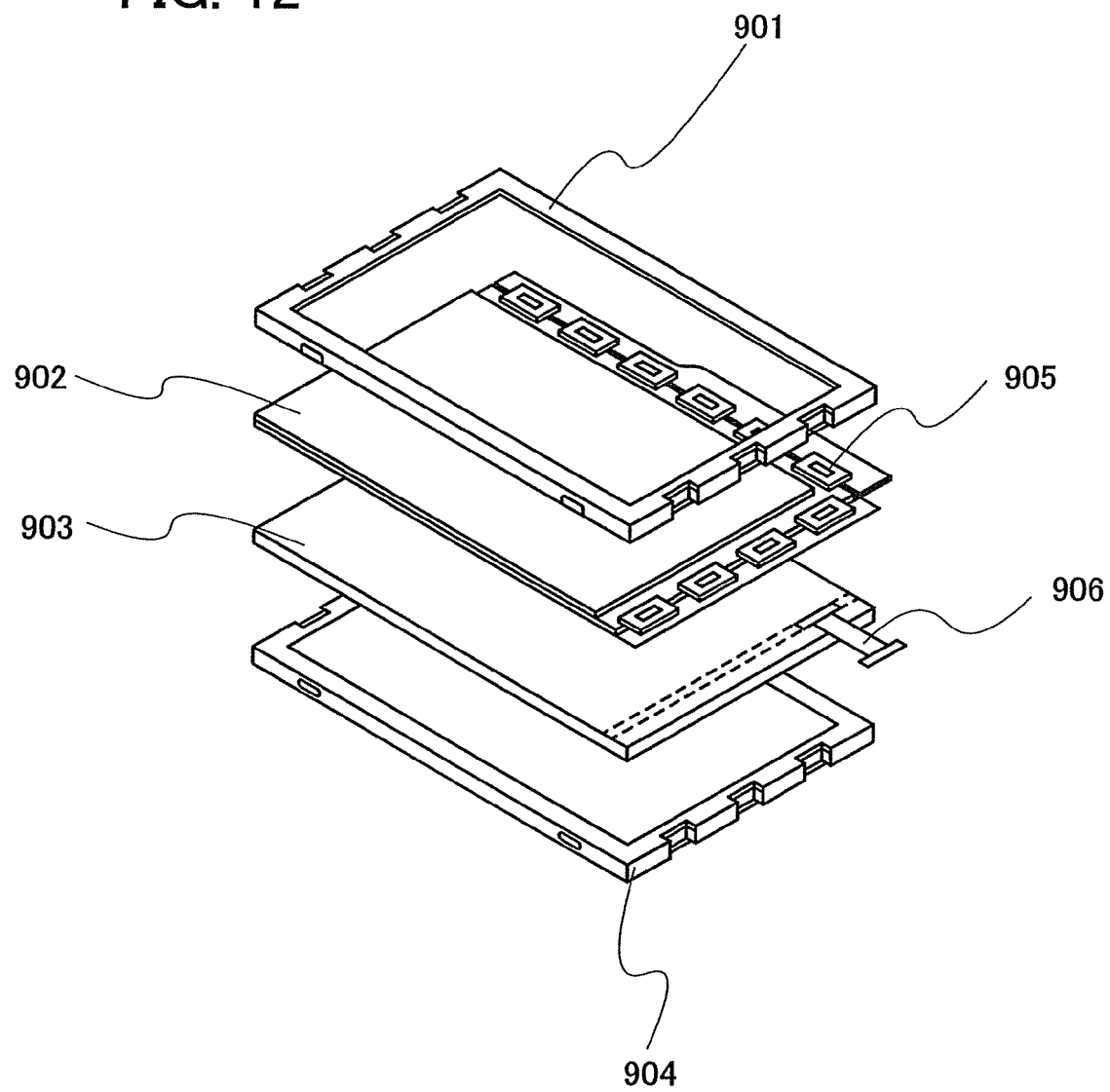
FIG. 12 illustrates an electronic device of the present invention.

FIG. 12 illustrates an example of a liquid crystal display device using a light-emitting device of the present invention as a backlight. The liquid crystal display device illustrated in FIG. 12 includes a housing 901, a liquid crystal layer 902, a backlight 903, and a housing 904. The liquid crystal layer 902 is connected to a driver IC 905. A light-emitting device of the present invention is used as the backlight 903, and current is supplied through a terminal 906.

By using a light-emitting device of the present invention as a backlight of the liquid crystal display device, the backlight can have high light emission efficiency. In addition, a backlight with a long lifetime can be obtained. A light-emitting device of the present invention is a plane emission type lighting device, and can have a large area. Therefore, the backlight can have a large area, and a liquid crystal display device having a large area can be obtained. Furthermore, a light-emitting device of the present invention has a thin shape and consumes low power; therefore, thickness and power consumption of a display device can also be reduced.

Figure 13:
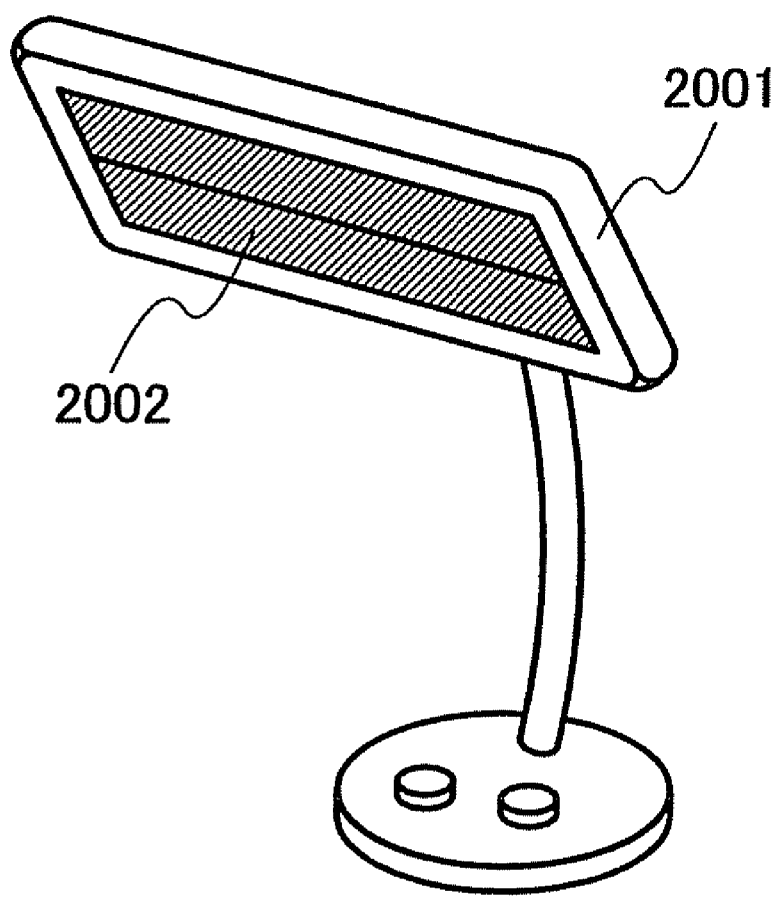
FIG. 13 illustrates a lighting device of the present invention.

FIG. 13 illustrates an example in which a light-emitting device according to the present invention is used as a desk lamp, which is one of lighting devices. The desk lamp illustrated in FIG. 13 includes a housing 2001 and a light source 2002, and a light-emitting device of the present invention is used as the light source 2002. Since a light-emitting device of the present invention has a long lifetime, the desk lamp can also have a long lifetime.

Figure 14:
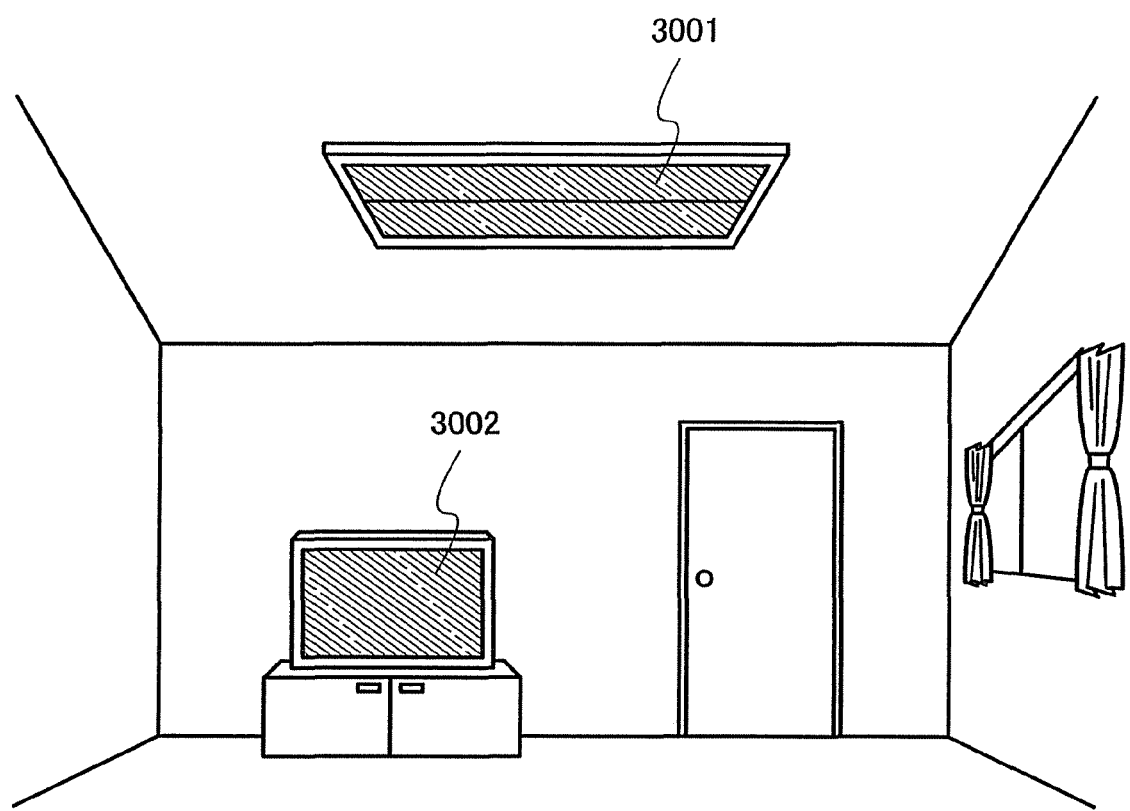
FIG. 14 illustrates a lighting device of the present invention.

FIG. 14 illustrates an example in which a light-emitting device to which the present invention is applied is used as an interior lighting device 3001. Since a light-emitting device of the present invention can also have a large area, a light-emitting device of the present invention can be used as a lighting device having a large emission area. Moreover, since a light-emitting device of the present invention has a long lifetime, the lighting device can also have a long lifetime. A television device 3002 of the present invention like the television set in FIG. 9A may be placed in a room where a light-emitting device according to the present invention is used as the interior lighting device 3001, and public broadcasting or movies can be watched there. In such a case, since both of the devices have long lifetimes, frequency of replacement of the lighting device and the television device can be reduced, and environmental load can be reduced.

Note that this embodiment can be combined with another embodiment mode as appropriate.

This application is based on Japanese Patent Application Serial No. 2007-243270 filed with Japan Patent Office on Sep. 20, 2007, the entire contents of which are hereby incorporated by reference.

What is claimed is:

1. A light-emitting element comprising:
   a first electrode;
   a first layer formed over the first electrode, wherein the first layer comprises a first organic compound and a second organic compound;
   a light-emitting layer formed over the first layer;
   a second layer formed over the light-emitting layer, wherein the second layer comprises a third organic compound and a fourth organic compound; and
   a second electrode formed over the second layer,
   wherein a weight percent of the first organic compound is higher than a weight percent of the second organic-compound,
   wherein a weight percent of the third organic compound is higher than a weight percent of the fourth organic compound,
   wherein the first organic compound has a hole transporting property,
   wherein the second organic compound has an electron transporting property,
   wherein the third organic compound has an electron transporting property,
   wherein the fourth organic compound has an electron trapping property, and
   wherein a lowest unoccupied molecular orbital level of the fourth organic compound is lower than a lowest unoccupied molecular orbital level of the third organic compound by 0.3 eV or more.

2. The light-emitting element according to claim 1, wherein a difference between a highest occupied molecular orbital level of the first organic compound and a highest occupied molecular orbital level of the second organic compound is less than 0.3 eV.

3. The light-emitting element according to claim 1, wherein the first organic compound is an aromatic amine compound, and wherein the second organic compound is a metal complex.

4. The light-emitting element according to claim 1, wherein $P_1/P_2 \geq 3$ or $P_1/P_2 \leq 0.33$ is satisfied where $P_1$ is a dipole moment of the first organic compound and $P_2$ is a dipole moment of the second organic compound.

5. The light-emitting element according to claim 1,
wherein a thickness of the first layer is from 5 nm to 20 nm, inclusive, and
wherein a thickness of the second layer is from 5 nm to 20 nm, inclusive.

6. The light-emitting element according to claim 1,
wherein the third organic compound is a metal complex.

7. The light-emitting element according to claim 1,
wherein the fourth organic compound is selected from the group consisting of a quinacridone derivative and a coumarin derivative.

8. The light-emitting element according to claim 1,
wherein the first electrode is an anode and has a light-transmitting property.

9. The light-emitting element according to claim 1,
wherein the second electrode is a cathode and a light-transmitting property.

10. The light-emitting element according to claim 1,
wherein the light-emitting layer comprises a fifth organic compound and a sixth organic compound, and
wherein the sixth organic compound has a light-emitting property.

11. The light-emitting element according to claim 10,
wherein the third organic compound and the fifth organic compound are different from each other.

12. An electronic device comprising, a display portion,
wherein the display portion is provided with a light-emitting element according to claim 1.

13. A light-emitting element comprising:
a first electrode;
a first layer formed over the first electrode;
a second layer formed over the first layer, wherein the second layer comprises a first organic compound and a second organic compound;
a light-emitting layer formed over the second layer;
a third layer formed over the light-emitting layer, wherein the third layer comprises a third organic compound and a fourth organic compound;
a fourth layer formed over the third layer; and
a second electrode formed over the fourth layer,
wherein a weight percent of the first organic compound is higher than a weight percent of the second organic compound in the second layer,
wherein a weight percent of the third organic compound is higher than a weight percent of the fourth organic compound in the third layer,
wherein the first layer has a hole injecting property,
wherein the fourth layer has an electron injecting property,
wherein the first organic compound has a hole transporting property,
wherein the second organic compound has an electron transporting property,
wherein the third organic compound has an electron transporting property,
wherein the fourth organic compound has an electron trapping property, and
wherein a lowest unoccupied molecular orbital level of the fourth organic compound is lower than a lowest unoccupied molecular orbital level of the third organic compound by 0.3 eV or more.

14. The light-emitting element according to claim 13,
wherein a difference between a highest occupied molecular orbital level of the first organic compound and a highest occupied molecular orbital level of the second organic compound is less than 0.3 eV.

15. The light-emitting element according to claim 13,
wherein the first organic compound is an aromatic amine compound, and
wherein the second organic compound is a metal complex.

16. The light-emitting element according to claim 13,
wherein $P_1/P_2 \geqq 3$ or $P_1/P_2 \leqq 0.33$ is satisfied where $P_1$ is a dipole moment of the first organic compound and $P_2$ is a dipole moment of the second organic compound.

17. The light-emitting element according to claim 13,
wherein a thickness of the second layer is from 5 nm to 20 nm, inclusive, and
wherein a thickness of the third layer is from 5 nm to 20 nm, inclusive.

18. The light-emitting element according to claim 13,
wherein the third organic compound is a metal complex.

19. The light-emitting element according to claim 13,
wherein the fourth organic compound is selected from the group consisting of a coumarin derivative and a quinacridone derivative.

20. The light-emitting element according to claim 13,
wherein the first electrode is an anode and has a light-transmitting property.

21. The light-emitting element according to claim 13,
wherein the second electrode is a cathode and has a light-transmitting property.

22. The light-emitting element according to claim 13,
wherein the light-emitting layer comprises a fifth organic compound and a sixth organic compound, and
wherein the sixth organic compound has a high light-emitting property.

23. The light-emitting element according to claim 22,
wherein the third organic compound and the fifth organic compound are different from each other.

24. The light-emitting element according to claim 13, further comprising a fifth layer interposed between the first layer and the second layer,
wherein the fifth layer has a hole transporting property.

25. The light-emitting element according to claim 13, further comprising a fifth layer interposed between the second layer and the light-emitting layer,
wherein the fifth layer has a hole transporting property.

26. The light-emitting element according to claim 13, further comprising a sixth layer interposed between the third layer and the fourth layer,
wherein the sixth layer has an electron transporting property.

27. The light-emitting element according to claim 13, further comprising a sixth layer interposed between the light-emitting layer and the third layer,
wherein the sixth layer has an electron transporting property.

28. An electronic device comprising, a display portion,
wherein the display portion is provided with a light-emitting element according to claim 13.

29. A light-emitting element comprising:
a first electrode;
a second electrode; and
a plurality of light-emitting units between the first electrode and the second electrode,
wherein at least one of the plurality of light-emitting units comprises:
a first layer comprising a first organic compound and a second organic compound;
a second layer comprising a third organic compound and a fourth organic compound; and
a light-emitting layer interposed between the first layer and the second layer, wherein the first organic compound has a hole transporting property and the second organic compound has an electron transporting property, and wherein the third organic compound has an electron transporting property and the fourth organic compound has an electron trapping property, wherein the plurality of light-emitting units are stacked, and wherein a lowest unoccupied molecular orbital level of the fourth organic compound is lower than a lowest unoccupied molecular orbital level of the third organic compound by 0.3 eV or more.

30. The light-emitting element according to claim 29, wherein emission colors of the plurality of light-emitting units are different from each other.

31. The light-emitting element according to claim 30, wherein the light-emitting element emits white light.

32. The light emitting element according to claim 29, wherein a difference between a highest occupied molecular orbital level of the first organic compound and a highest occupied molecular orbital level of the second organic compound is less than 0.3 eV.

33. The light-emitting element according to claim 29, wherein the first organic compound is an aromatic amine compound, and wherein the second organic compound is a metal complex.

34. The light-emitting element according to claim 29, wherein $P_1/P_2 \geq 3$ or $P_1/P_2 \leq 0.33$ is satisfied where a dipole moment of the first organic compound is $P_1$ and a dipole moment of the second organic compound is $P_2$.

35. The light-emitting element according to claim 29, wherein a thickness of the first layer is from 5 nm to 20 nm, inclusive, and wherein a thickness of the second layer is from 5 nm to 20 nm, inclusive.

36. The light-emitting element according to claim 29, wherein the third organic compound is a metal complex.

37. The light-emitting element according to claim 29, wherein the fourth organic compound is selected from the group consisting of a coumarin derivative and a quinacridone derivative.

38. The light-emitting element according to claim 29, wherein the first electrode has a light-transmitting property.

39. The light-emitting element according to claim 29, wherein the second electrode has a light-transmitting property.

40. The light-emitting element according to claim 29, wherein the light-emitting layer comprises a fifth organic compound and a sixth organic compound, and wherein the sixth organic compound has a high light-emitting property.

41. The light-emitting element according to claim 40, wherein the third organic compound and the fifth organic compound are different from each other.

42. An electronic device comprising, a display portion, wherein the display portion is provided with a light-emitting element according to claim 29.

* * * * *